(12) United States Patent
Jørgensen

(10) Patent No.: US 9,714,745 B2
(45) Date of Patent: Jul. 25, 2017

(54) COLOR MIXING ILLUMINATION DEVICE

(75) Inventor: Dennis Jørgensen, Rønde (DK)

(73) Assignee: MARTIN PROFESSIONAL APS, Aarhus N. (DK)

( * ) Notice: Subject to any disclaimer, the term of this patent is extended or adjusted under 35 U.S.C. 154(b) by 378 days.

(21) Appl. No.: 14/128,021

(22) PCT Filed: Jun. 29, 2012

(86) PCT No.: PCT/DK2012/050235
§ 371 (c)(1),
(2), (4) Date: Jan. 15, 2014

(87) PCT Pub. No.: WO2013/000481
PCT Pub. Date: Jan. 3, 2013

(65) Prior Publication Data
US 2014/0119005 A1    May 1, 2014

(30) Foreign Application Priority Data

Jun. 29, 2011 (DK) ................................ 2011 70338
Aug. 22, 2011 (DK) ................................ 2011 70461

(51) Int. Cl.
*F21V 14/06* (2006.01)
*F21K 99/00* (2016.01)
(Continued)

(52) U.S. Cl.
CPC .................. *F21K 9/56* (2013.01); *F21K 9/64* (2016.08); *F21S 10/026* (2013.01); *F21V 14/02* (2013.01);
(Continued)

(58) Field of Classification Search
CPC .. F21K 9/56; F21K 9/58; F21S 10/026; F21V 14/02; F21V 14/06
See application file for complete search history.

(56) References Cited

U.S. PATENT DOCUMENTS 5,309,277 A     5/1994  Deck
6,048,080 A *   4/2000  Belliveau ............... F21S 10/00
                                                359/621
(Continued)

FOREIGN PATENT DOCUMENTS

EP     1413919 A1    4/2004
EP     1710493 A2    10/2006
(Continued)

OTHER PUBLICATIONS

Extended European Search Report dated May 13, 2015 in Application No. 12 80 3716.
International Search Report, PCT/DK2012/050235, Jun. 29, 2012.

*Primary Examiner* — Anabel Ton
(74) *Attorney, Agent, or Firm* — Artegis Law Group, LLP

(57) ABSTRACT

An illumination device or method of generating illumination using an illumination device is described with two light sources with different spectral distribution a number of displaceable light collectors collecting light from the light sources where in one mixing position receiving light from both light sources where at least one of the light sources has two independently controllable light emitting areas and in one mixing position the collecting area collects light form the first light emitting area and substantially not from the second light emitting area. Further an unrelated illumination device with at least one Light Emitting Diode, LED and a current spreader connected to and covering a first area of a first side of the lead, spreading current in an irregular pattern and a current controller controlling current flowing through the first current spreader. The current spreader can be patterned to produce a round beam illumination or illumination in a form of a static picture or logo. A round beam illumination can better cooperate with an optical system of lenses in an illumination device. Further the current spreader (Continued)

can be patterned to have lower current density in the center to reduce/avoid temperature hotspot in the center and obtain a more even die temperature.

8 Claims, 15 Drawing Sheets

(51) Int. Cl.
    *F21S 10/02*     (2006.01)
    *F21V 14/02*     (2006.01)
    *H01L 33/14*     (2010.01)
    *H01L 33/38*     (2010.01)
    *F21K 9/64*     (2016.01)
    *F21W 131/406*     (2006.01)
    *F21Y 101/00*     (2016.01)
    *F21Y 115/10*     (2016.01)
    *F21Y 113/17*     (2016.01)

(52) U.S. Cl.
    CPC ............... *F21V 14/06* (2013.01); *H01L 33/14* (2013.01); *H01L 33/38* (2013.01); *F21W 2131/406* (2013.01); *F21Y 2101/00* (2013.01); *F21Y 2113/17* (2016.08); *F21Y 2115/10* (2016.08)

(56) References Cited

U.S. PATENT DOCUMENTS

| | | | |
|---|---|---|---|
| 6,227,669 B1 | 5/2001 | Tiao et al. | |
| 6,402,347 B1 | 6/2002 | Maas et al. | |
| 6,443,594 B1 | 9/2002 | Marshall et al. | |
| 6,585,395 B2 * | 7/2003 | Luk | F21V 14/02 362/249.02 |
| 7,226,185 B2 | 6/2007 | Dolgin et al. | |
| 7,942,540 B2 * | 5/2011 | Harbers | F21K 9/54 362/247 |
| 8,297,766 B2 * | 10/2012 | Harbers | F21K 9/54 362/247 |
| 8,337,031 B2 * | 12/2012 | Wegh | F21K 9/135 362/248 |
| 9,010,967 B2 * | 4/2015 | Jensen | F21V 5/008 362/296.01 |
| 2001/0007527 A1 | 7/2001 | Lammers et al. | |
| 2002/0080615 A1 | 6/2002 | Marshall et al. | |
| 2005/0211997 A1 | 9/2005 | Suehiro et al. | |
| 2007/0013879 A1 | 1/2007 | Imade et al. | |
| 2008/0042148 A1 | 2/2008 | Bilenko et al. | |
| 2008/0230791 A1 | 9/2008 | Lin et al. | |
| 2008/0291683 A1 | 11/2008 | Chinniah et al. | |
| 2009/0225552 A1 | 9/2009 | Chen | |
| 2009/0268458 A1 | 10/2009 | Feinbloom et al. | |
| 2010/0052000 A1 | 3/2010 | Ko et al. | |
| 2010/0258824 A1 | 10/2010 | Wang et al. | |

FOREIGN PATENT DOCUMENTS

| | | |
|---|---|---|
| EP | 2718620 A1 | 4/2014 |
| JP | 2001156329 A | 6/2001 |
| JP | 2004004359 A | 1/2004 |
| JP | 2004111648 A | 4/2004 |
| JP | 2006269182 A | 10/2006 |
| WO | 9833007 A1 | 7/1998 |
| WO | 0198706 A1 | 12/2001 |
| WO | 02089275 A1 | 11/2002 |
| WO | 2006023180 A1 | 3/2006 |
| WO | 2008133160 A1 | 11/2008 |
| WO | 2011076215 A1 | 6/2011 |

* cited by examiner

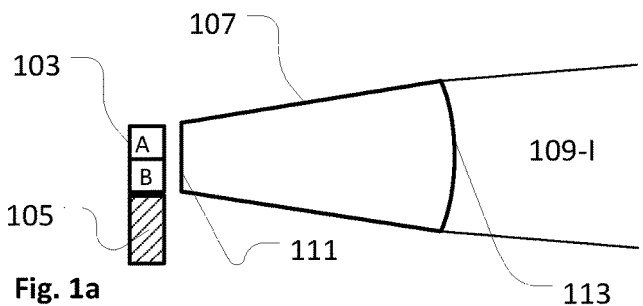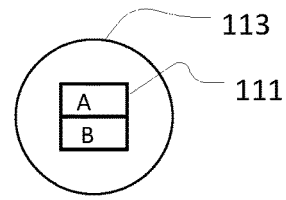
Fig. 1a    Fig. 1a'
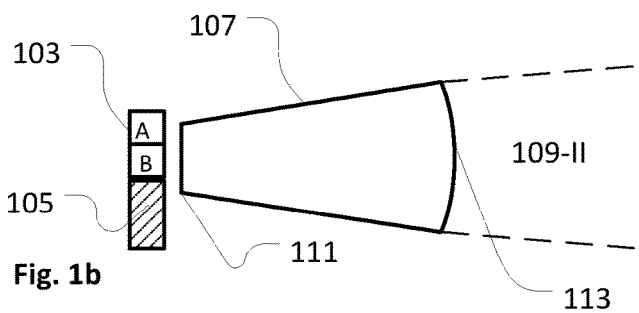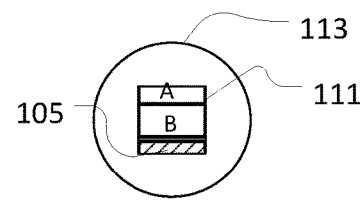
Fig. 1b    Fig. 1b'
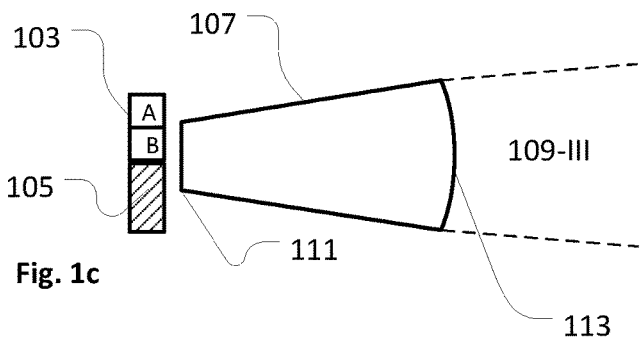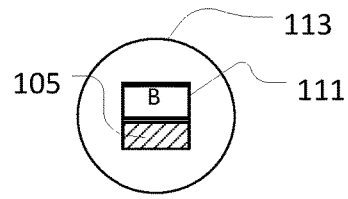
Fig. 1c    Fig. 1c'
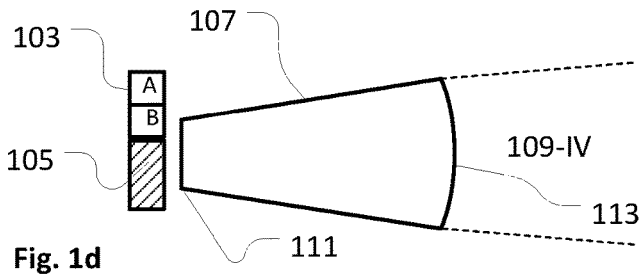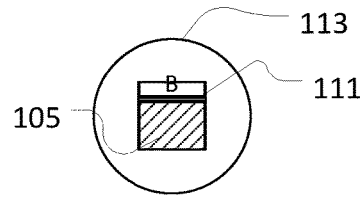
Fig. 1d    Fig. 1d'
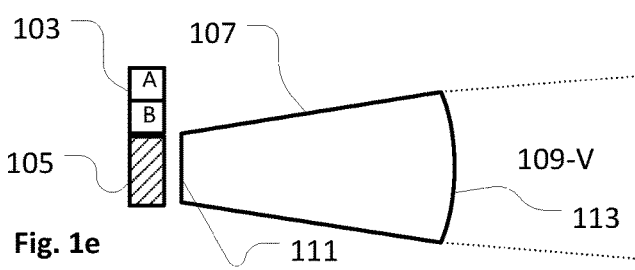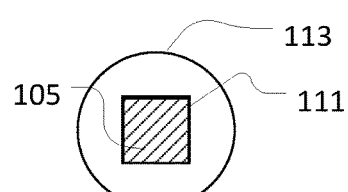
Fig. 1e    Fig. 1e'

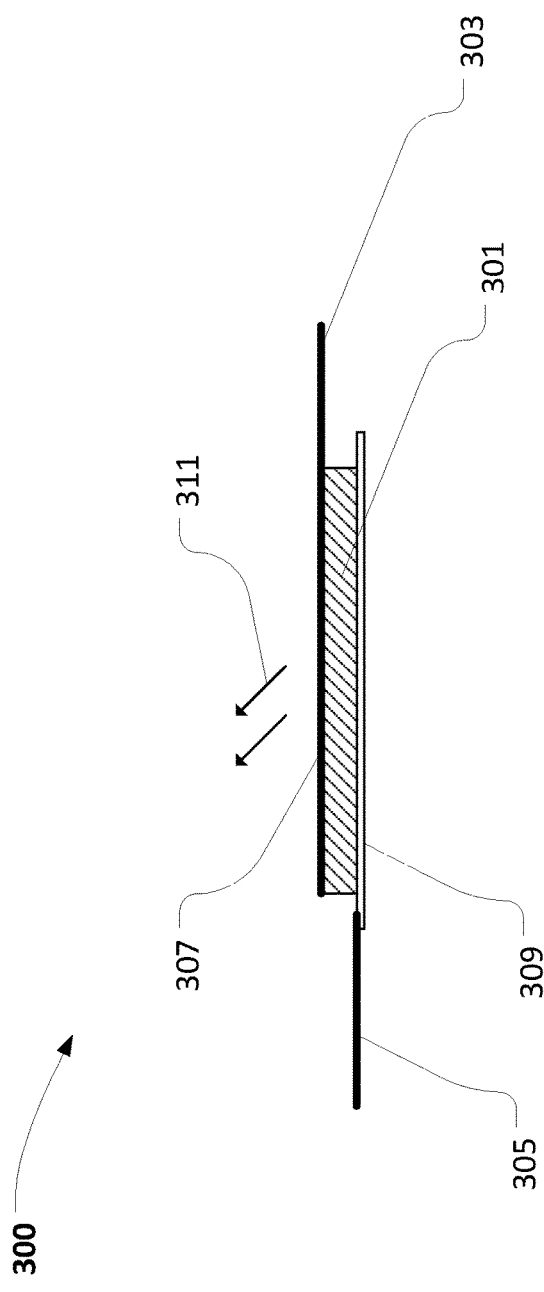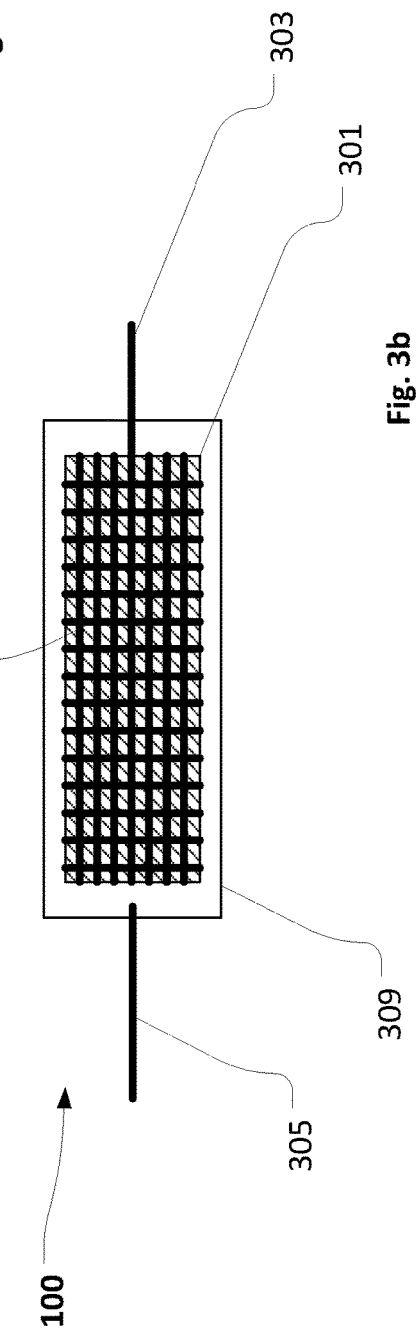

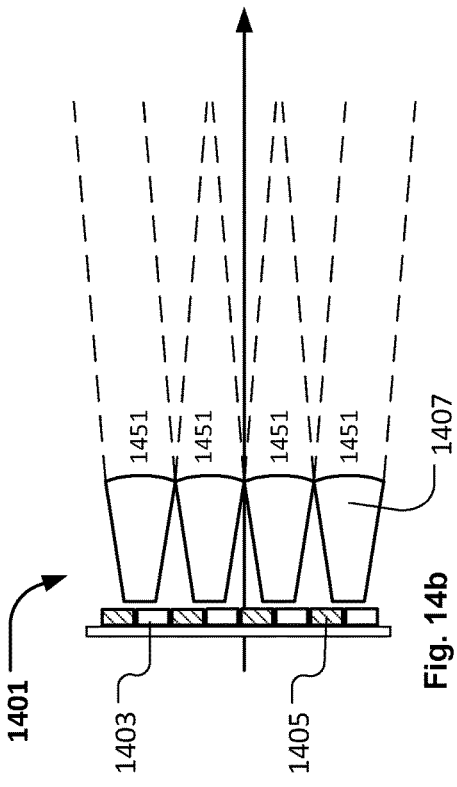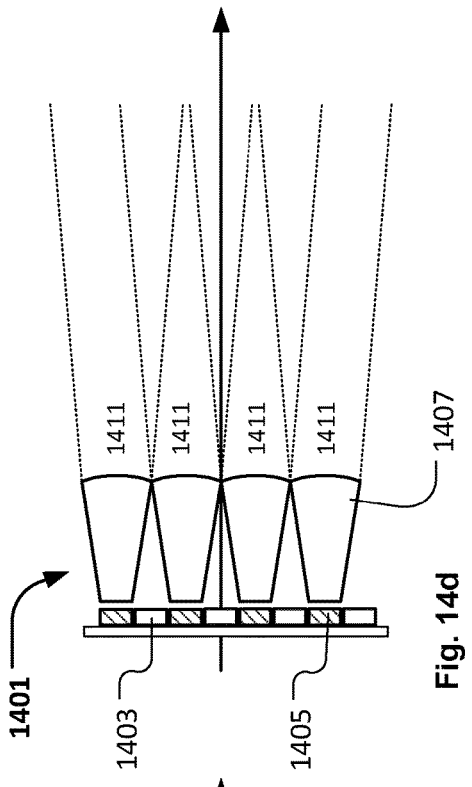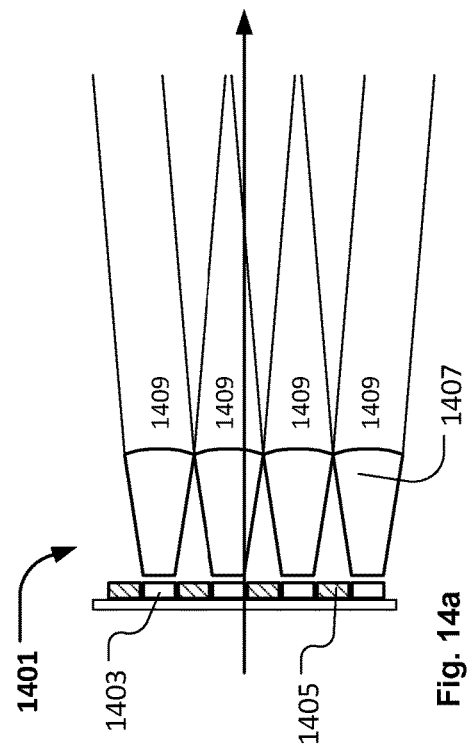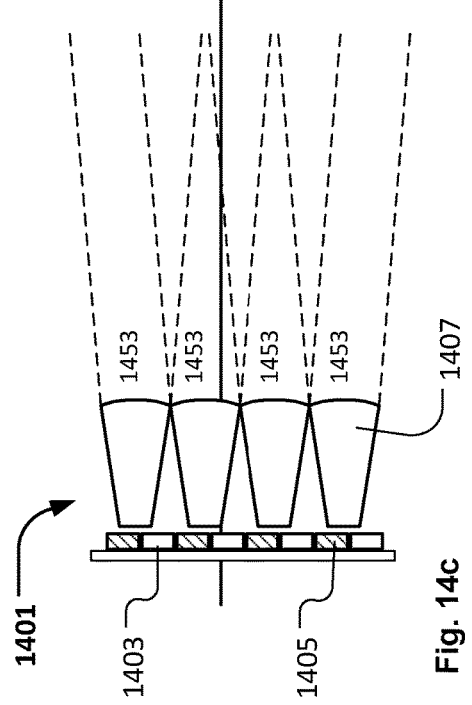

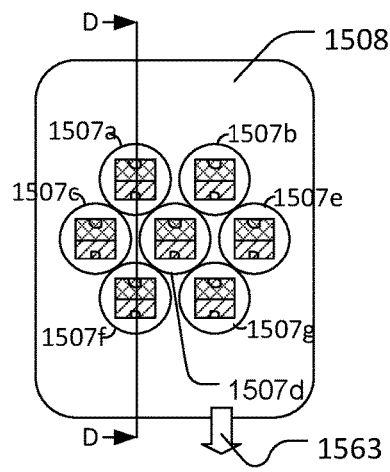
Fig. 15g
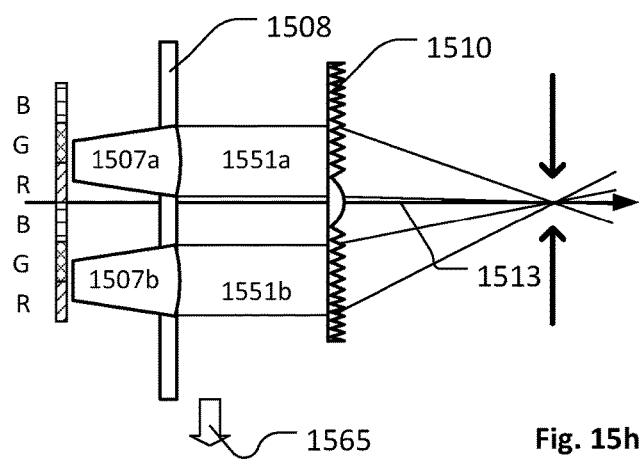
Fig. 15h
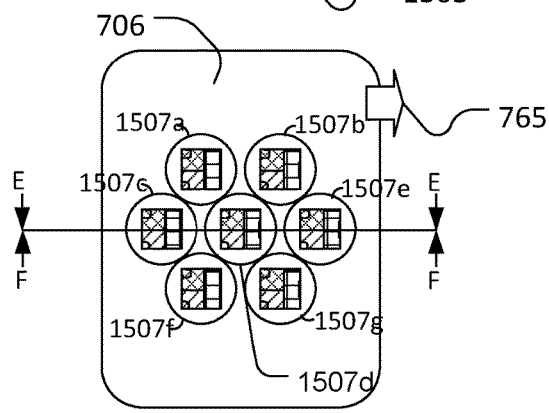
Fig. 15i
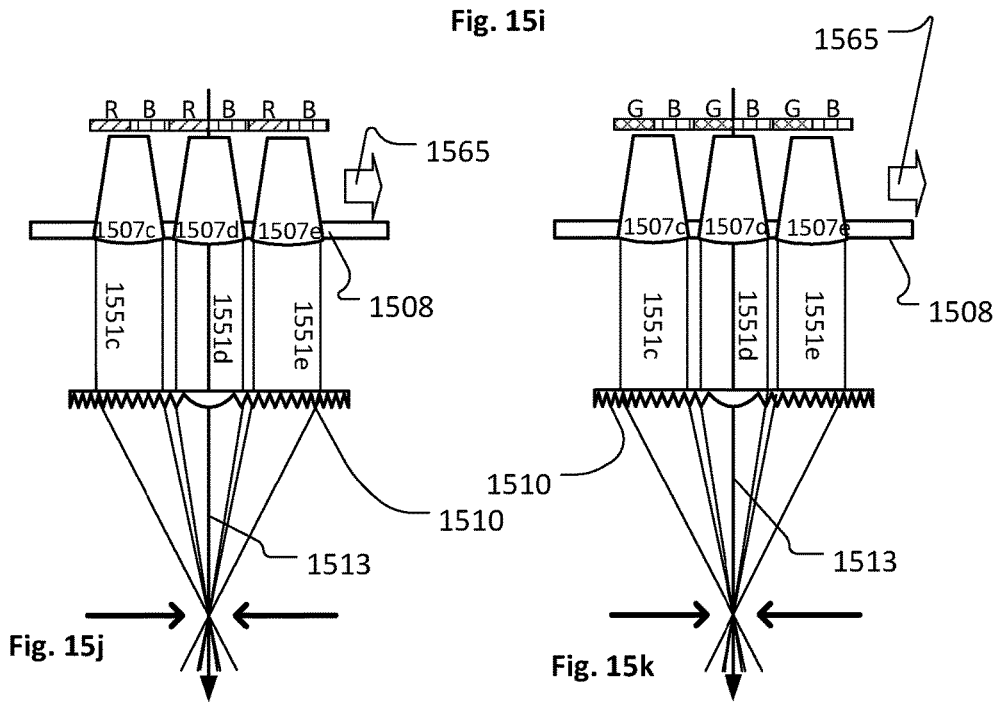
Fig. 15j
Fig. 15k

COLOR MIXING ILLUMINATION DEVICE

FIELD OF THE INVENTION

The present invention relates light emitting diodes and illumination devices comprising light emitting diodes.

BACKGROUND OF THE INVENTION

Light fixtures creating various effects are getting more and more used in the entertainment industry in order to create various light effects and mood lighting in connection with concerts, live shows, TV shows, sport events or as a part on architectural installation. Entertainment light fixtures creates typically light beam having a beam width and a divergence and can for instance be wash/flood fixtures creating a relatively wide light beam with a uniform light distribution or it can be profile fixtures adapted to project image onto a target surface.

Light emitting diodes (LED) are, due to their relatively low energy consumption or high efficiency, long lifetime, and capability of electronic dimming, becoming more and more used in connection with lighting applications. LEDs are used in lighting applications for general illumination such as wash/flood lights illuminating a wide area or for generating wide light beams e.g. for the entertainment industry and/or architectural installations. For instance like in products like MAC101™, MAC301™, MAC401™, Stagebar2™, Easypix™, Extube™, Tripix™, Exterior 400™ series provided by the applicant, Martin Professional a/s. Further LEDs are also being integrated into projecting systems where an image is created and projected towards a target surface. For instance like in the product MAC 350 Entrour™ provided by the applicant, Martin Professional A/S.

The light in projecting systems is generally collected into an optical gate where the image is generated, and an imaging optical system projects the gate onto a target surface. WO0198706, U.S. Pat. No. 6,227,669 and U.S. Pat. No. 6,402,347 disclose lighting systems comprising a number of LEDs arranged in a plane array where a converging lens is positioned in front of the LED in order to focus the light, for instance to illuminate a predetermined area/gate or for coupling the light from the diodes into an optical fiber.

U.S. Pat. No. 5,309,277, U.S. Pat. No. 6,227,669, WO0198706, JP2006269182 A2, EP1710493 A2, U.S. Pat. No. 6,443,594 disclose lighting systems where the light from a number of LEDs is directed towards a common focal point or focusing area, for instance by tilting the LEDs in relation to the optical axis (JP2006269182 A2, WO0198706, U.S. Pat. No. 5,309,277) or by using individually refracting means positioned in front of each LED (U.S. Pat. No. 6,443,594, U.S. Pat. No. 7,226,185B, EP1710493).

WO06023180 discloses a projecting system comprising a LED array with a multiple number of LEDs where the light from the LEDs is directed towards a target area.

The prior art fixtures try to increase the lumen output by adding as many light sources as possible. The consequence is, however, that the efficiency with regard to power consumption versus light output is very low, as it is fundamentally only possible to effectively utilize light sources of same or less Etendue as the imaging optics in this kind of optical system. So if the source Etendue is a close match to the Etendue of the imaging system there are no gains in using multiple sources in order to increase the light output (intensity/lumen) as the Etendue of the light sources then will be larger than the Etendue of the imaging system and the imaging system is thus not capable of collecting the light Furthermore, a large amount of light is lost as the prior art fixtures typically only couple a central part of the light of the light beams through the gate in order to provide a uniform illumination of the gate, which again reduces the efficiency. The space in light fixtures is often limited and it is difficult to fit many light sources into prior art fixtures, for instance because the optical components associated with the light sources often take up a lot of space. Yet another aspect is the fact that color artifacts often appear in the output from fixtures having light sources of different colors. The reason for this is the fact that high performance LEDs used for stage-illumination have large, rectangular die areas of 1-12 mm2 and even higher This implies, that it is not possible to model the primary optics to a point source since the size-ratio between the primary optics and the LED die can get rather small. Furthermore, the rectangular shape can also be imaged in the output as rectangular patches. Compared to discharge lamps, these patches are ill fitted to smoothly fill out the circular spot profiles of stage-illumination instruments.

DESCRIPTION OF THE INVENTION

The object of the present invention is to solve the above described limitations related to prior art. This is achieved by an illumination device and a LED as described in the independent claims. The dependent claims describe possible embodiments of the present invention. The advantages and benefits of the present invention are described in the detailed description of the invention.

DESCRIPTION OF THE DRAWING

FIG. 1a-1e illustrate a principle drawing of an illumination device according to the present invention;

FIGS. 3a and 3b illustrate the structure an embodiment of an typical LED;

FIG. 14a-14d illustrates an illumination device according to the present invention comprising a multiple number of light collectors;

FIG. 15*a*-15*k* illustrates an illumination device according to the present invention comprising a multiple number of light collectors.

DETAILED DESCRIPTION OF THE INVENTION

Figure 2A:
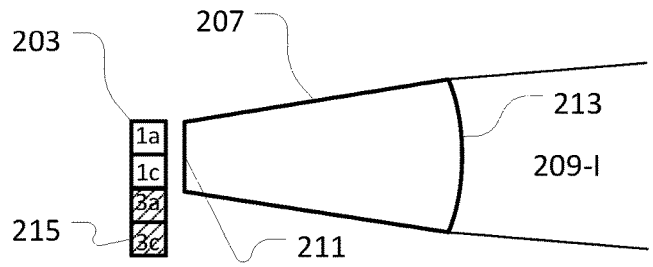
FIG. 2a-2e illustrate a principle drawing of another illumination device according to the present invention.
Figure 2A:
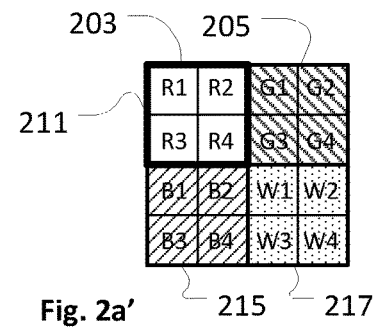

FIG. 1*a-e'* illustrate a principle drawing of the illumination device according to the present invention and illustrates the principles of the invention. FIG. 1*a-e* are a side views of the illumination device and illustrate five different positions of the light collector in relation the light sources. FIG. 1*a'-e'* illustrate a simplified top view of the light collector at the corresponding positions and illustrates light sources 103 and 105 as seen through the exit surface 113 and the entrance surface 111 of the light collector.

The illumination device comprises a number of light sources comprising at least a first light sources 103 (illustrated as white quadrangles) and a second source 105 (illustrated as hatched quadrangles). The first and second light sources generate light having different spectral distribution. A light collecting means 107 is adapted to collect light generated by light sources and to convert the collected light into a light beam 109, where the light beam propagate along an optical axis.

The light sources and the light collecting means are displaceable in relation to each other and can be positioned and fixed in a number of mixing positions. In the mixing positions the light collecting means are adapted to collect a part of the light generated by the first light source and a part of the light second light source, and the light collecting means converts the collected light into a mixed light beam 109. Further the light sources and light collecting means can be positioned and fixed in a number of non-mixing positions where the light collector collect light from only of the light sources.

At least one of the light sources comprises a first emitting area A and a second emitting area B where the first emitting area A and the second emitting area B can be controlled activated and controlled individually and independent of each other by controlling means (not shown).

The illustrated illumination device makes it possible to provide a very efficient illumination device which can be optimized with regard to Etendue for both mixed and non-mixed light. This can be archived as the light collecting means can be optimized to create light beams, which are optimized to the Etendue for instance in relation to an optical system along the optical axis. The Etendue can be optimized to both mixed light beams and non-mixed light beams, as the light collecting mean can be adapted to be moved in relation to the light sources and to collect light form different parts of the light sources. Further by dividing at least one of the light sources in an number of emitting areas, which can be individual and independently controlled makes it possible to optimize the efficacy of the illumination device, as light emitting areas wherefrom the light collecting means do not collect light can be turned off whereby no light will be lost from these areas and as a result energy can be reduced and saved. In addition hereto it will be possible to cool the light sources even more efficient as less heat will be generate when part of the light sources have been turns off which will result in the fact that further heat can be dissipated from the activated emitting areas. This will be further explained in connection with FIG. 1*a-e'*, where FIG. 1*b/b'*, 1*c/c'*, 1*d/d'* illustrates three different mixing positions and FIG. 1*a/a'* and FIG. 1*e/e'* illustrate two non-mixing positions. The different positions will be described below. The emitting areas can for instance be embodied as individual typical LEDs as illustrated in FIG. 3*a*-3*b* where the LED are arranged as close as possible in order to avoid having areas where not light is emitted, as such would reduce the amount of collected light. The amount of non-emitting areas between the emitting areas can be further reduced be embodying the light sources as describe and illustrated in FIG. 4-11.

In FIGS. 1*a* and 1*a'* the light collector is arranged with its' entrance surface 111 above the first light source and collects most of the light generated by the first light source and does not collect light from the second light source. In this non-mixing position the light collector collects light from both the first emitting area A and the second emitting area B. As a consequence the light beam 109-I will comprise light from the first light source and thus have the same spectral distribution as the light generated by the first light source. In this non-mixing position it is possible to provide a light beam having maximum intensity of the light from the first light source and the where the Etendue also can be optimized. In this non-mixing position the second group light source can be turned off whereby energy can be saved.

In FIGS. 1*b* and 1*b'* the light collector is arranged such that approximately ¾ of the first light source and approximately ¼ the second light source are positioned below the entrance surface. As a consequence approximately ¾ of the light collected by the light collecting means 107 are generated by the first light sources and ¼ of the light collected by the light collecting means 107 are generated by the second light source. The light collecting means 107 will convert and mix the collected light into the mixed light beam 109-II which will appear as a mixture of the light from the first light source and second light source. The light beams will thus have a spectral distribution comprising spectral components from both groups of light sources where the spectral component from the first light source is dominant. Further the light collector 107 collects light from both the first emitting area A and the second emitting area B and these can both be activated in this position in order to provide maximum intensity.

In FIGS. 1*c* and 1*c'* the light collector is arranged such that approximately ½ of the first light source and approximately ½ of the second light source are positioned below the entrance surface. As a consequence approximately ½ of the light collected by the light collecting means 107 are generated by the first light source and ½ of the light collected by the light collecting means 107 are generated by the second light source. In this position the light beams will have a spectral distribution comprising spectral components from both light sources where the spectral components from the two light sources are substantial equally weighted (assumed that the light sources emits the same intensity of light). Further in this mixing position the light collector 107 does not collect light form the first light emitting area A and this part can be turned off without effecting the intensity of the light beam 109-III. By turning the light emitting area A off when the light collector does not collect light form the light emitting area A prevents light and energy waste.

In FIGS. 1*d* and 1*d'* the light collector is arranged such that approximately ¼ of the first light source and approximately ¾ of the second light source are positioned below the entrance surface. As a consequence approximately ¼ of the light collected by the light collecting means 107 are generated by the first light source and ¾ of the light collected by the light collecting means 107 are generated by the second light source. In this position the light beams will have a spectral distribution comprising spectral components from both groups of light sources where the spectral components from the second light source are the dominating. Further in this mixing position the light collector 107 does like in FIG. 1c not collect light form the first emitting area A and this part can be turned off without effecting the intensity of the light beam 109-IV. By turning the light emitting area A when the light collector does not collect light form the light emitting area A prevents light and energy waste.

In FIGS. 1e and 1e' the light collector is arranged with its' entrance surface 111 above the second light source and collects most of the light generated by the second group of light sources and does not collect light from the first light source. As a consequence the light beam 109-V will comprise light from the second light source and thus have the same spectral distribution as the light generated by the second light source. In this non-mixing position it is possible to provide a light beam having maximum intensity of the light from the second light source and the where the Etendue also can be optimized. In this non-mixing position the first group light source can be turned off whereby energy can be saved.

In the embodiment illustrated in FIG. 1a-e' the illumination device comprise one light collector and one first light source and one second light source, where only the first light source comprise two individual and independently controllable emitting areas. However it is to be understood the illumination device can be embodied with any number of light collecting means and any number of corresponding first and second light sources. Further it is to be understood that the second light source also can comprise a number of individual and independently controllable light emitting areas, which for instance can lead to the fact that parts of the second light source also be turned off when the light collector does not collect light therefrom. Further it is noticed that the light source can be divided into any number of light emitting areas.

FIG. 2a-g' illustrate another simplified embodiment of an illumination device according to the present invention. The figures illustrates the principles of the invention, where FIG. 2a-g are a side views and FIG. a'-g' are a modeled top view of the entrance surface 211 and illustrate how the entrance surface 211 are arranged in relation the light sources.

Like the illumination device in FIG. 1a-1e' the illumination device comprise light collecting means 207 displaceable in relation to number of light sources groups. In this embodiment the light sources are arranged in a first, second, third and a fourth group of light sources (illustrated as quadrangles having different shading). In this embodiment the first group of light sources comprises at least one light source 203 having a first emitting area R1, a second emitting area R2, a third emitting area R3 and a fourth emitting area R4. Similar each of the second, third and fourth light sources comprises at least a first emitting area (G1, B1, W1), a second emitting area (G2, B2, W2), a third emitting area (G3, B3, W3) and a fourth emitting area (G4, B4, W4).

In FIG. 2a'-2g' the entrance surface 211 of the light collecting means is illustrated as a thick quadrangle and the light sources are illustrate as quadrangles a having different shading and where the different emitting areas of the light sources are illustrated as quadrangles with a thinner lines.

In the illustrated embodiment the light sources are embodied as LEDs, where the first light source 203 emit red light, the second light source 205 emit green light, the third light source 215 emit blue light and the fourth light source 217 emit white light. Each of LED has four emitting areas which are individually and independently controllable and can be embodied as described in FIG. 6-8

The light collecting means is embodied as a light mixing rod having a quadrangle entrance surface and a round exit surface 213 and can for instance be embodies as described in the patent application titled "OPTICAL LIGHT MIXER PROVIDING A HOMOGENIZED AND UNIFORM LIGHT BEAM" filed by the applicant in Denmark on 25 Nov. 2011 under application number PC//DK2011/050450 and incorporated herein by reference. However other kinds of light mixing rods having different shapes may be used.

Like the illumination device in FIG. 1a-e' the light sources 203, 205, 215, 217 and the light collecting means 217 are displaceable in relation to each other and can be positioned and fixed in a number of mixing positions. In the mixing positions the light collecting means are adapted to collect a part of the light generated by at least two of the light sources and to convert the collected light into a mixed light beam 209. Further the light sources and light collecting means can be positioned and fixed in a number of non-mixing positions where the light collector collect light from only one of the light sources Different positions of the light collecting means in relation the light sources are illustrated in the FIGS. 2a-2g' and will be described below.

In FIGS. 2a and 2a' the light collector is arranged with its' entrance surface 211 above the first light source 203 and collects most of the light generated by the first group light sources and does not collect light from the other light sources. In this non-mixing position the light collector collects light from all of the emitting areas R1, R2, R3 and R4. As a consequence the light beam 209-I will comprise light from the first group of light sources and thus have the same spectral distribution as the light generated by the first light source. In the illustrated embodiment this will correspond to a saturated red light beam as the first light source 203 is a red LED. In this non-mixing position the other light sources can be turned off whereby energy can be saved. This leads to the fact that ¾ of the light sources can be turned off causing energy saving and the saturated light beam can still be optimized in relation to Etendue as the light collector will collect light from only one kind of light source.

Figure 2B:
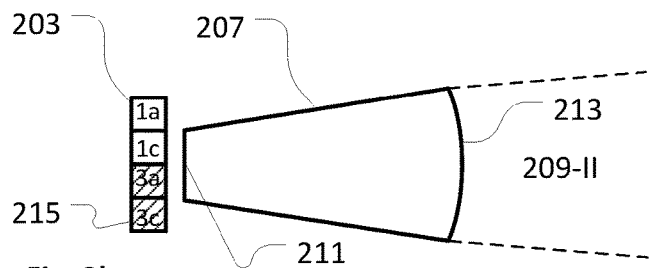
Figure 2B:
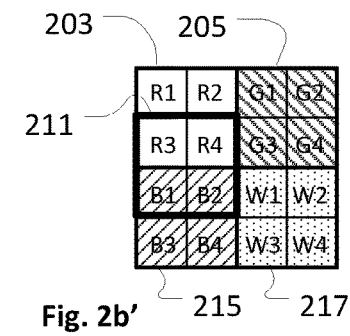

In FIGS. 2b and 2b' the light collector is arranged such that emitting areas R3 and R4 of the first light source 203 and the emitting areas B1 and B2 of the third light source 215 are positioned below the entrance surface 211. The mixed light beam 209-II appears as a mixture of the light from the first light source and the third light source. In this embodiment the mixed light beam will be a mixture of red and blue light resulting in a purple light beam. The skilled person realize that the color of the resulting light beam depends not only on the relation of emitting area where from the light collector collect light but also on the intensities that light emitted by the two kind of light sources have in relation to each other. The light sources where from the light collector does not collect light can be turned off and it is noticed that by providing light sources with individual and independently light emitting areas makes it possible to turn off the emitting areas wherefrom the light collector does not collect light. In other words the illumination device can be adapted to turn on only the emitting areas wherefrom the light collector collects light. As a consequence in this mixing position the emitting areas R1, R2, G1, G2, G3, G4, W1, W2, W3, W4, B3, B4 can be turned off without effecting the mixed light beam.

Figure 2C:
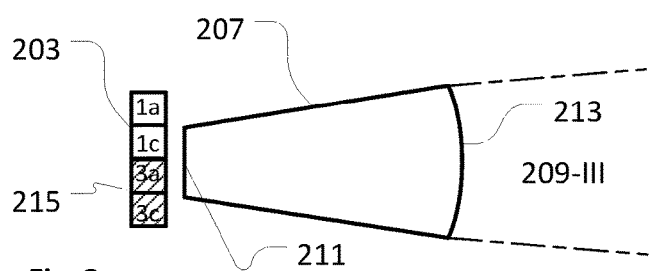
Figure 2C:
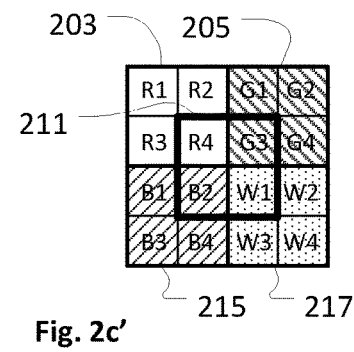

In FIGS. 2c and 2c' the light collector is arranged such that emitting area R4 of the first light source 203, the emitting area G3 of the second light source, the emitting area B2 of the third light source 215 and the emitting area W1 of the fourth light source 217 all are positioned below the entrance surface 211. The mixed light beam 209-III appears thus as a mixture of the light from all groups of light sources In this embodiment the mixed light beam will be a mixture red, green, blue and white light resulting in a white light beam. In this position the emitting areas R1, R2, R3, G1, G2, G4, B1, B3, B4, W2, W3 and W4 can be turned off in order to save energy.

Figure 2D:
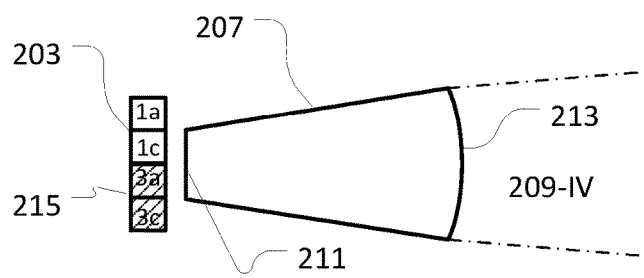
Figure 2D:
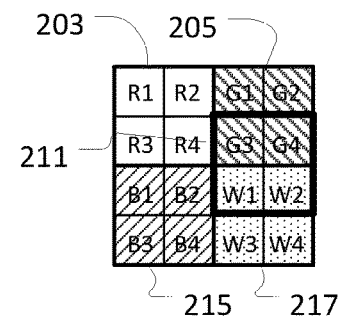

In FIGS. 2*d* and 2*d'* the light collector is arranged such that the emitting areas G3 and G¤ of the second light source and emitting areas W1 and W2 of the fourth light source 217 all are positioned below the entrance surface 211. The mixed light beam 209-IV appears thus as a mixture of the light from the second and fourth light sources. In this embodiment the mixed light beam 209-IV will be a mixture of green and white light resulting in green toned white light. In this position the emitting areas R1, R2, R3, R4, G1 G2, B1, B2, B3, B4, W3, and W4 can be turned off in order to save energy.

Figure 2E:
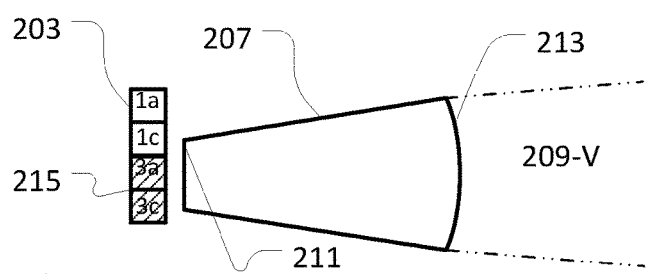
Figure 2E:
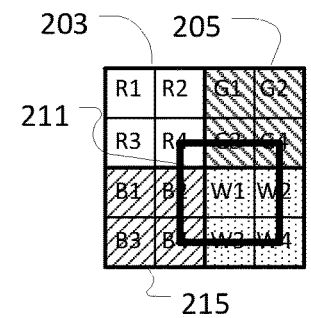

In FIGS. 2*e* and 2*e'* the light collector is arranged such that at part of the emitting areas R4, G3, G4, B2, B4, W2, W3, W4 and the full area of emitting area W1 are positioned below the entrance surface 211. The mixed light beam 209V appears thus as a mixture of the light from all groups of light sources, where most light have been collected from the fourth group of light sources. In this embodiment the mixed light beam will be a mixture of red, green, blue and white light resulting in a toned white light beam, where toning is determined by the ration between the red, green and blue areas. In this mixing position the emitting areas R1, R2, R3, G1, G2, B1 and B3 3*c* can be turned off and compared to the positions in FIG. 2*a*-2*d'* described above the number of emitting areas that can be turned off has be reduced to 7 instead of 12. However this is still an improvement compared to the situation where the light sources have not been divided into emitting areas and thus emits light which are not collected by the light collector.

It is to be understood that only a very few positions of the light collector in relation to the light sources have been shown and that a large number of different positions can be provided.

FIG. 3*a* (cross sectional view) and 3*b* (top view) illustrate the structure of a typical LED 300 according to prior art. The LED comprises a LED die 301 comprising of a LED die material as known in the art of solid state lighting. The LED die 301 is connected to a first wire 303 and a second wire 305 respectively through a current spreader 307 and an electrical conductive surface 309 whereon the LED die 301 is mounted.

Current is feed into the LED die through the first wire 303 and the current spreader 307, and passes through the LED whereby light is generated and emitted as illustrated by arrows 311. The current is then let away by the electrical conductive surface 309 and the second wire 305. The current spreader 307 is embodies as a grid of thin electrical conducting threads and serves to distribute the current running through the LED die evenly across the LED die area whereby the LED die emit light from its' entire surface.

It is also possible let the current flow in the opposite direction; however this requires that the LED die is flipped 180 degrees as known in the art of light emitting diodes.

The emitting areas of the light sources can be embodied as individual LED.

Figure 4:
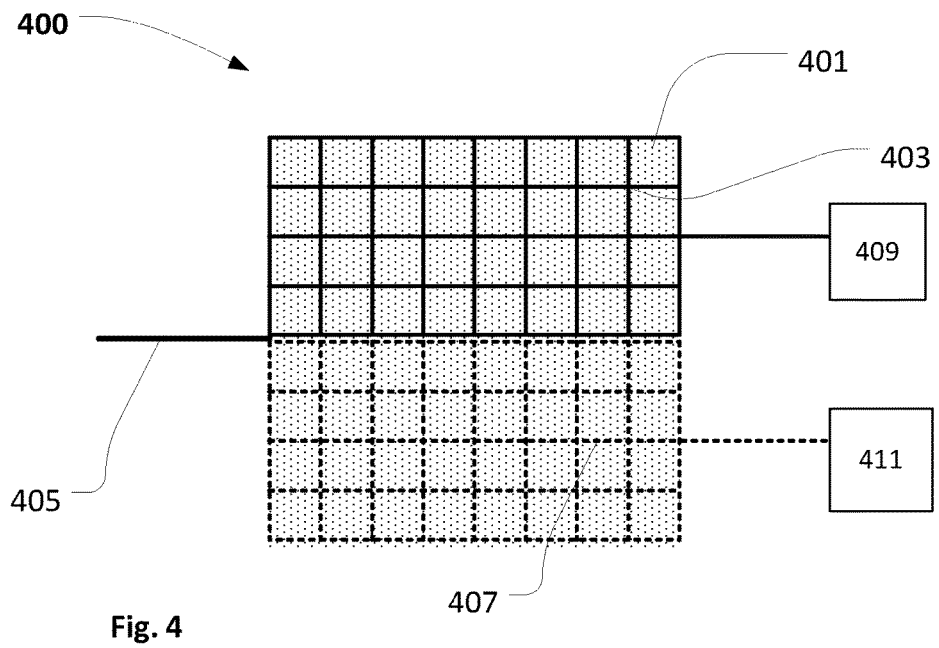
FIG. 4 illustrate the a structure of a LED suitable for the illumination device according to the present invention.

FIG. 4 illustrates a top view of a LED having a number of emitting areas. The illustrated LED can be used in the illumination device illustrated in FIG. 1*a*-1*e* and result in the fact the emitting areas of the same light source can be arranged very close to each other.

The illustrated LED comprises 400:
a LED die 401 (shaded quadrangle);
a first current spreader 403 electronically connected to a first side of the LED die. The first current spreader 403 covers a first area of the first side of the LED die;
a second wire 405 electronically connected to a second side of said LED die;
a second current spreader 407 electronically connected to the first side of the LED die. The second current spreader covers a second area of the first side of the LED die.

The first current spreader 403 can be connected to first current controlling means 409 controlling the current flowing through the first current spreader. The second current spreader 411 can be connected to second current controlling means 411 controlling the current flowing through the second current spreader. The current controlling means can be constructed as any electronic device capable of controlling the current flowing through an electronic circuit.

The current flowing through the first current spreader will flow through the LED die 401 and to the second wire 405 LED die, where by light is emitted from the LED die. Similar the current flowing through the second current spreader 407 will flow through the LED die 401 and to the second wire 405 LED die, where by light is emitted from the LED die.

The LED 400 can be used as the first light source 103 illustrated in FIG. 1*a*-*e'* and the LED die area below the first current spreader 403 will constitute the first emitting area A of the first light source, as this part of the LED die will emit light when current is flowing through the first current spreader. Similar the LED die area covered by the second current spreader 407 will constitute the second emitting area B of the first light source 103. The two current spreaders make it possible to provide two emitting areas very close to each other whereby more light can be collected by the light collector 107.

Figure 5:
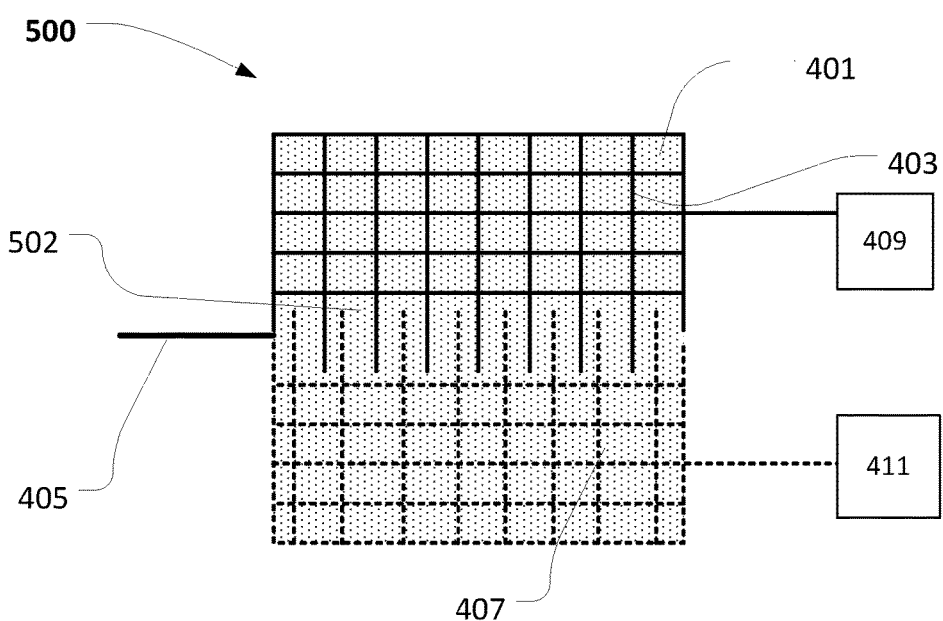
FIG. 5 illustrate the a structure of another LED suitable for the illumination device according to the present invention.

FIG. 5 illustrates a top view of a LED 500 having a number of emitting areas. The illustrated LED is similar to the LED illustrated in FIG. 4 and similar features are labeled with the same reference numbers. The difference between the LED in FIG. 4 and this LED is the fact that the first and current spreaders 403 and 407 have been adapted to overlap in an overlapping region. 502. In the overlapping region the first and second current spreader is capable of conducting current through the LED die 401 and this region can thus be activated to emit light by both the first and second current controlling means.

Figure 6:
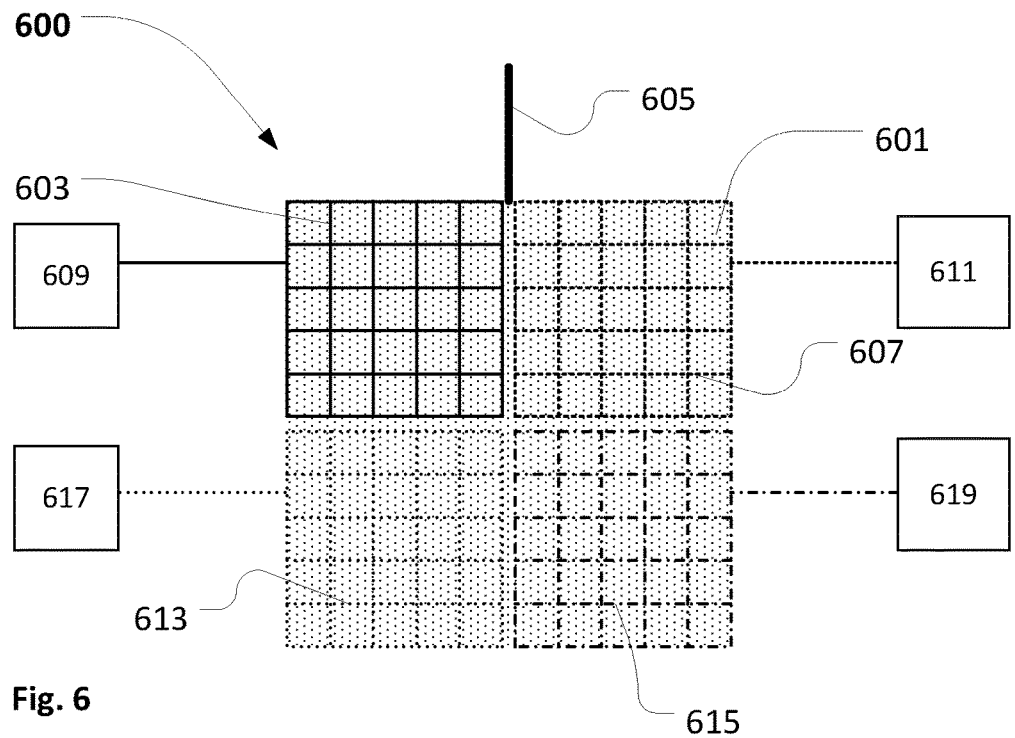
FIG. 6 illustrates a structure of another LED suitable for the illumination device according to the present invention.

FIG. 6 illustrates a top view of a LED 601 having a four emitting areas. The illustrated LED can be used in the illumination device illustrated in FIG. 2*a*-2*e'* and result in the fact the emitting areas of the same light source can be arranged very close to each other.

The illustrated LED comprises 600:
a LED die 601 (shaded quadrangle);
a first current spreader 603 electronically connected to a first side of the LED die. The first current spreader 603 covers a first area of the first side of the LED die;
a second wire 605 electronically connected to a second side of said LED die;
a second current spreader 607 electronically connected to and covering a second area of the first side of the LED die.

a third current spreader 613 electronically connected to and covering a third area of the first side of the LED die.

a fourth current spreader 615 electronically connected to and covering a fourth area of the first side of the LED die.

The first 603, second 607, third 613 and fourth 615 current spreader are respectively connected to first 609, second 911, third 617 and fourth 619 current controlling means, which is capable of controlling the current through the related current spreaders.

The LED 600 can for instance be used as the first light source 203 illustrated in FIG. 2*a*-*e'*. Where LED die area below the first current spreader 603 will constitute the first emitting area R1, the LED die area below the second first current spreader 607 will constitute the first emitting area R2, the LED die area below the third current spreader 613 will constitute the third emitting area R3 and the LED die area below the fourth current spreader 615 will constitute the fourth emitting area R4. However it is noticed that the other LED of the illumination device illustrated in FIG. 2*a*-*e'* also can be embodied a LED similar to the LED 601. However this requires that the led die material have be chosen so that appropriated color will be emitted. It is also notated that the color of the light can be generated based on phosphor material.

Figure 7:
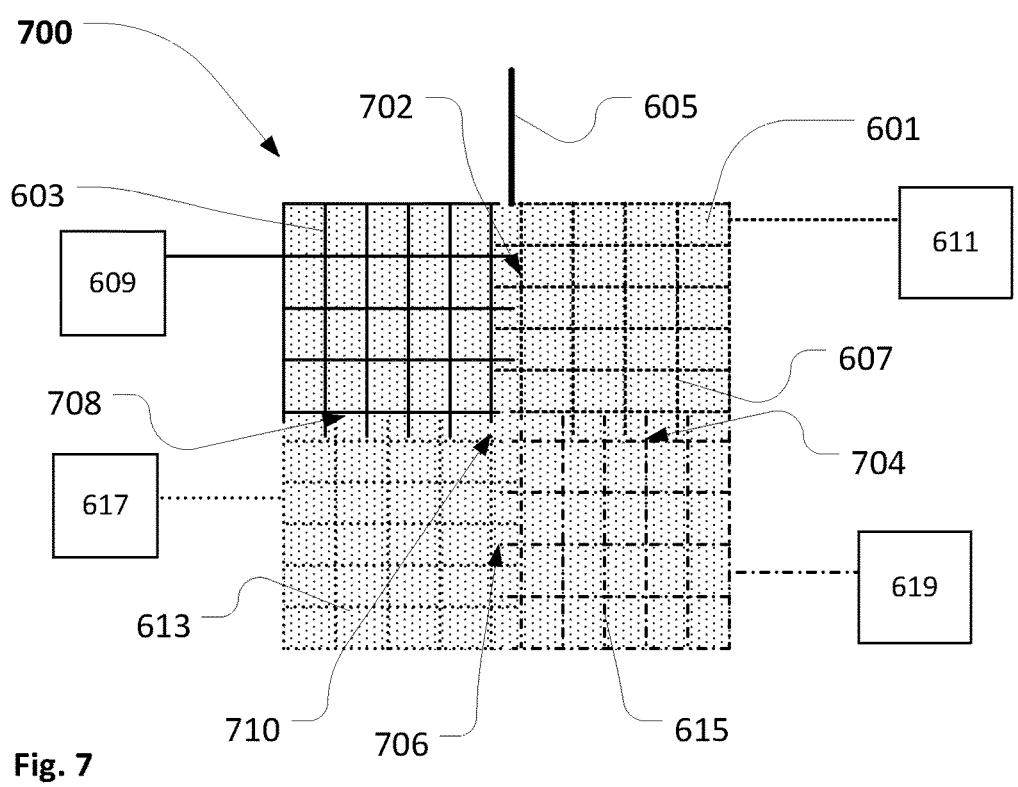
FIG. 7 illustrates a structure of another LED suitable for the illumination device according to the present invention.

FIG. 7 illustrates a top view of a LED 700 similar to the LED illustrated in FIG. 6 and similar features are labeled with the same reference numbers and will not be describe here. In this embodiment the first, second, third and fourth current spreaders have been adapted to overlap in a number of overlapping regions, where the first and second current spreader overlaps in overlapping region 702, the second and third current spreader in overlapping region 704, the third and fourth current spreader in overlapping region 706, the fourth and first current spreader in overlapping region 708. The central part of the LED functions as a common overlapping region 710 where all the current spreaders overlap.

Figure 8:
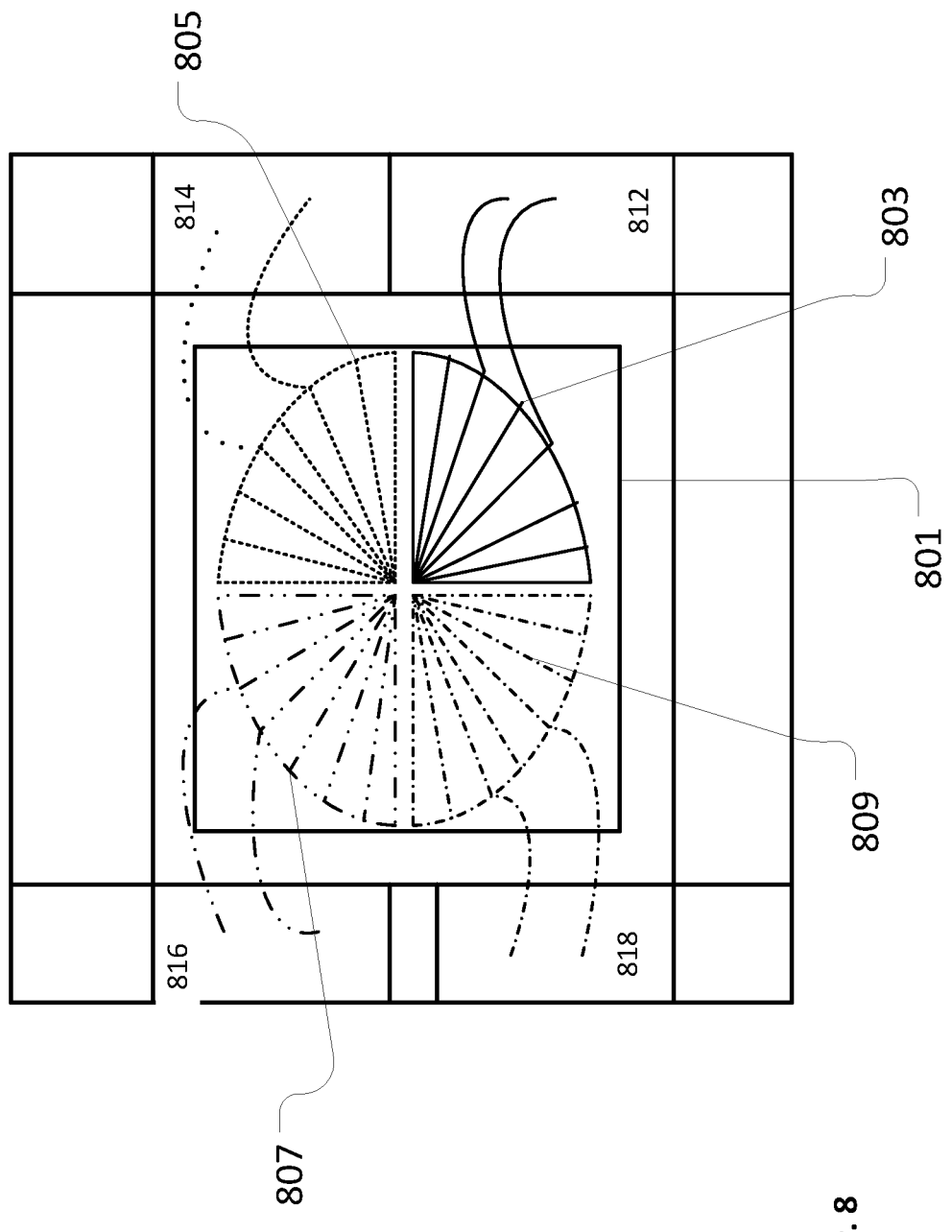
FIG. 8 illustrates a structure of another LED suitable for the illumination device according to the present invention.

FIG. 8 illustrates another embodiment of an LED having a number of emitting areas. In this embodiment the first side of the LED die 801 is covered by four current spreaders 803, 805, 807 and 809 arranged as pie shaped areas forming a circle.

This LED makes it possible to provide a multi-color LED on a single die LED. This can for instance be achieved by a LED as illustrated in FIG. 8 where the LED die 801 is embodied a blue die emitting blue light. Current spreaders 803, 807 and 809 are covered by a color converting materials adapted to convert light having at least a first wavelength to light having a second wavelength different from the first wavelength. For instance current spreader 803 may be covered by a converting material capable of converting blue light into green light, current spreader 807 may be covered by a converting material capable of converting blue light into red light and current spreader 809 may be covered by converting material capable of converting blue light into white light. As a consequence the different current spreader regions will emit light having different color and the different current spreader regions can be controlled individually which makes it possible to combine the color in different ratios by controlling the current through the different current spreader regions e.g. by using PWM regulation, DC regulation or any other current regulating technique. The described multi-color LED will be an RGBW multi-color LED, however it is to be understood that any kind of multicolor LED can be provided. The converting material can for instance be phosphor converting material or quantum dots. It is noted that the LED die may also be emitting non visible light and that all current spreader regions in such embodiment can be covered by converting material which can convert the non-visible light into visible light.

Such multicolor LED can for instance be used as light sources in a mechanical color mixing system as described herein. The mechanical color mixing illumination device described herein comprises:

a number of light sources generating light; and a number of light collecting means adapted to collect the generated light and to convert the transform light into a number light beams propagating along an optical axis; wherein the light sources are arranged in a first group of light sources and in a second group of light sources, where the first and second group of light sources emit light having different spectral distribution; and wherein the number of light sources and the light collecting means are displaceable in relation to each other and can be positioned in a number of mixing positions, where in the number of mixing positions the light collecting means are adapted to collect at least a part of said light emitted by said first group of light sources and at least a part of said light emitted by said second group of light sources and to convert said collected light into number of mixed light beams. The different areas of the LED die covered by different current spreaders and divergent converting material can acts as the different group of light sources.

Each current spreader 803, 805, 807 and 809 can be divided into a number of sub-current regions which makes it possible to activate only at part of light generating region. This if for instance useful when the multi-color LED is used in a in a mechanical color mixing system as described above as this makes it possible to turn off part off the parts of each color section which is not collected by the light collector. The current spreaders are connected to electrical conductors 812, 814, 816, 818 in the PCB whereon the LED die are mounted and each electrical conductor is connected to corresponding current controlling means.

For instance a color changing system realized by moving collecting optics such as for instance a mixing rod relative to adjacent dies of different colors (or alternative phosphor's of different color), to adjust the relative proportion accepted from these colors. Then at some positions the collecting/mixing optics will only accept the light coming from for instance 25% of the die area, while for the other die it would collect 75%. Now this would lead to a significant loss of appros 75% of the radiation from the first die. But if the moving collecting optics were combined with LED's where different regions of the die could be controlled independently for each color the regions of the dies from which the light is lost can be turned of increasing efficiency. The more regions the better but even with 2-4 regions there will be significant improvements.

Figure 9:
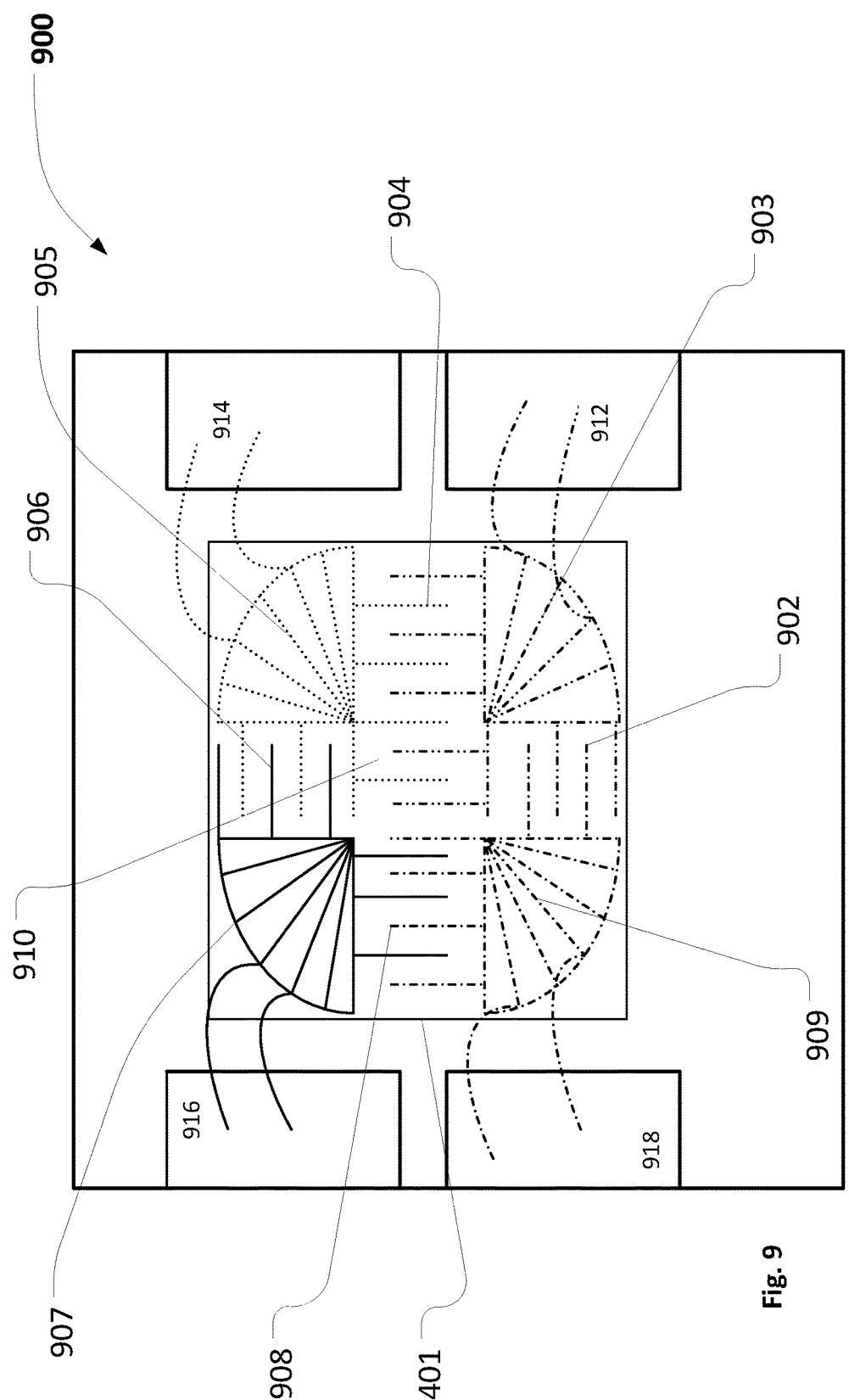
FIG. 9 illustrates a structure of another LED suitable for the illumination device according to the present invention.

FIG. 9 illustrates another embodiment a LED having a number of emitting areas. In this embodiment the first side of the LED die 901 is covered by four current spreaders 903, 905, 907 and 909 arranged as pie shaped areas forming a circle. The current spreaders are connected to electrical conductors 912, 914, 916, 918 in the PCB whereon the LED die are mounted and each electrical conductor is connected to corresponding current controlling means. However there are a number of regions where at least two the current spreaders overlaps. For instance:

current spreaders 903 and 909 overlap in region 902;

current spreader 903 and 905 overlap in region 904;

current spreaders 905 and 907 overlap in region 906;

current spreader 907 and 909 overlap in region 908; and all current spreader overlap in region 910.

Figure 10:
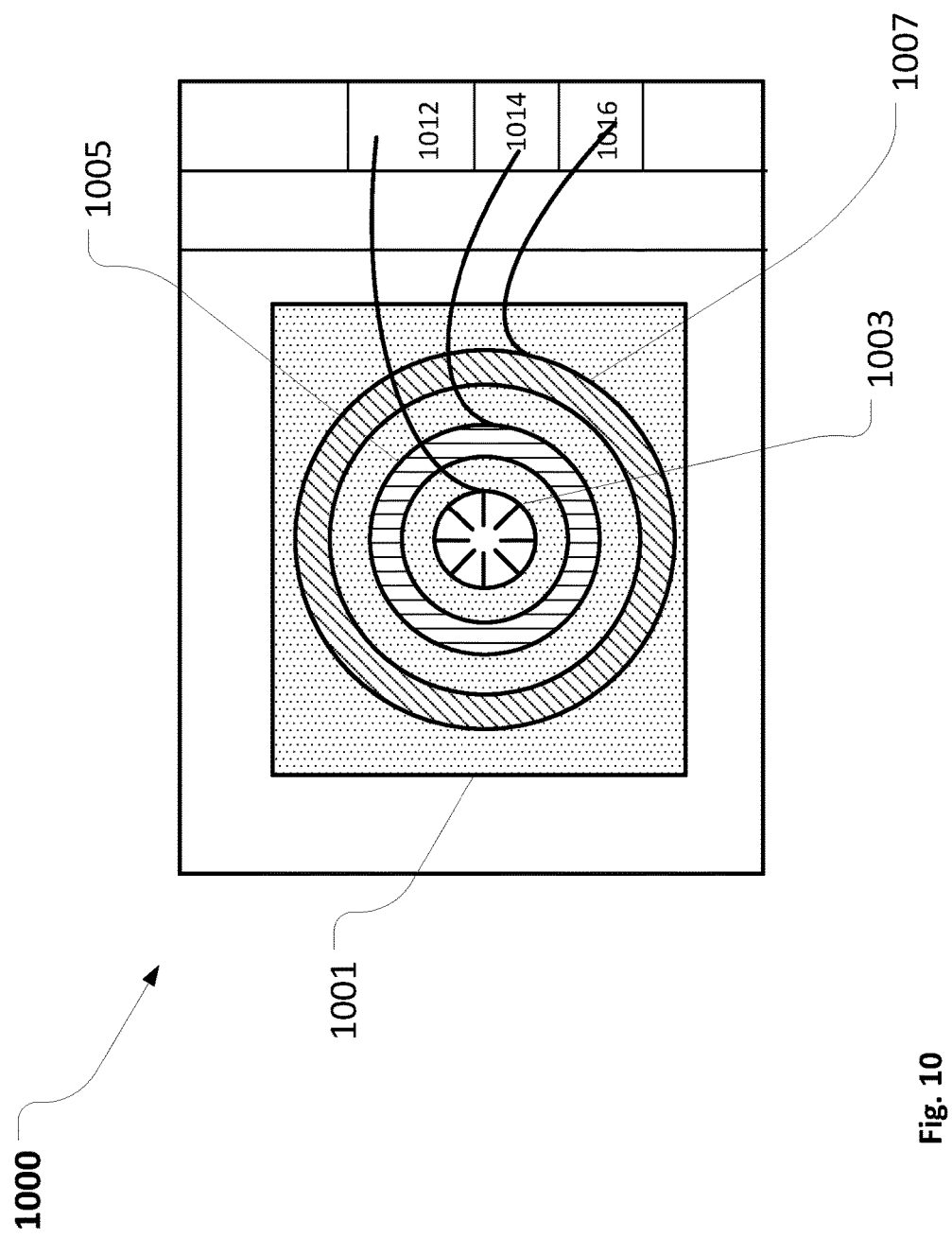
FIG. 10 illustrates a structure of another LED suitable for the illumination device according to the present invention.

FIG. 10 illustrates another embodiment a LED having a number of emitting areas. In this embodiment the firs current spreader 1003 is formed as a circle and the second 1005 and third current 1007 spreaders are formed as concentric circles surrounding the first current spreader. The current spreaders are connected to electrical conductors 1012, 1014, 1016, in the PCB whereon the LED die are mounted and each electrical conductor is connected to corresponding current controlling means.

By applying separately controllable current spreader on different regions of the die area it is possible to:

1) By using two or more concentric rings where current density can be adjusted individually, light distribution (hotspot ration)=center intensity/edge intensity can be controlled dynamically.
2) If dynamic control of hotspot is realized on several colors, for instance Red, Green, and Blue in for instance a color cube combiner the colors can be controlled in each concentric ring dynamically.
3) if a mechanical Iris is used in combination with concentric ring control, the outer rings of the die can be turned off as the iris closes, in this way power can be saved, and or as the total thermal load is reduced the current density and output of the central part can be increased improving output compared with a standard uniform current density LED.
4) Further if the central rings are turned off one by one a inverse Iris effect or "cone effect" can be achieved where light is removed from center and out. If a cone gobo is used, central part can be turned off reducing total thermal load, hence current density and output from outer ring/rings can be increased
5) Control of the concentric rings can be used as an electronic zoom, and inverse Iris.
6) The controllable regions could in principle be any shape and numbers, by having control of fours quadrants of the dies (=quarter circles or squares) it would be possible to make a rotating effect in both intensity and/or colors.

As the wire bonds can not be too long, I have made a current spreader design with three overlapping concentric rings and lead in to reduce length of wire bonds (it will be difficult to make more than 3 rings without long wirebonds. I know the central ring will also generate light all the way to the wirebond. But if several of these LED's are overlayed and rotated respectively it would not cause a problem. Another way around would be to put an insulation layer beneath the current spreader where it is not intended to spread current (generate light), this could potentially also be a way for different spreaders to cross each other but will require more production steps.

Figure 11:
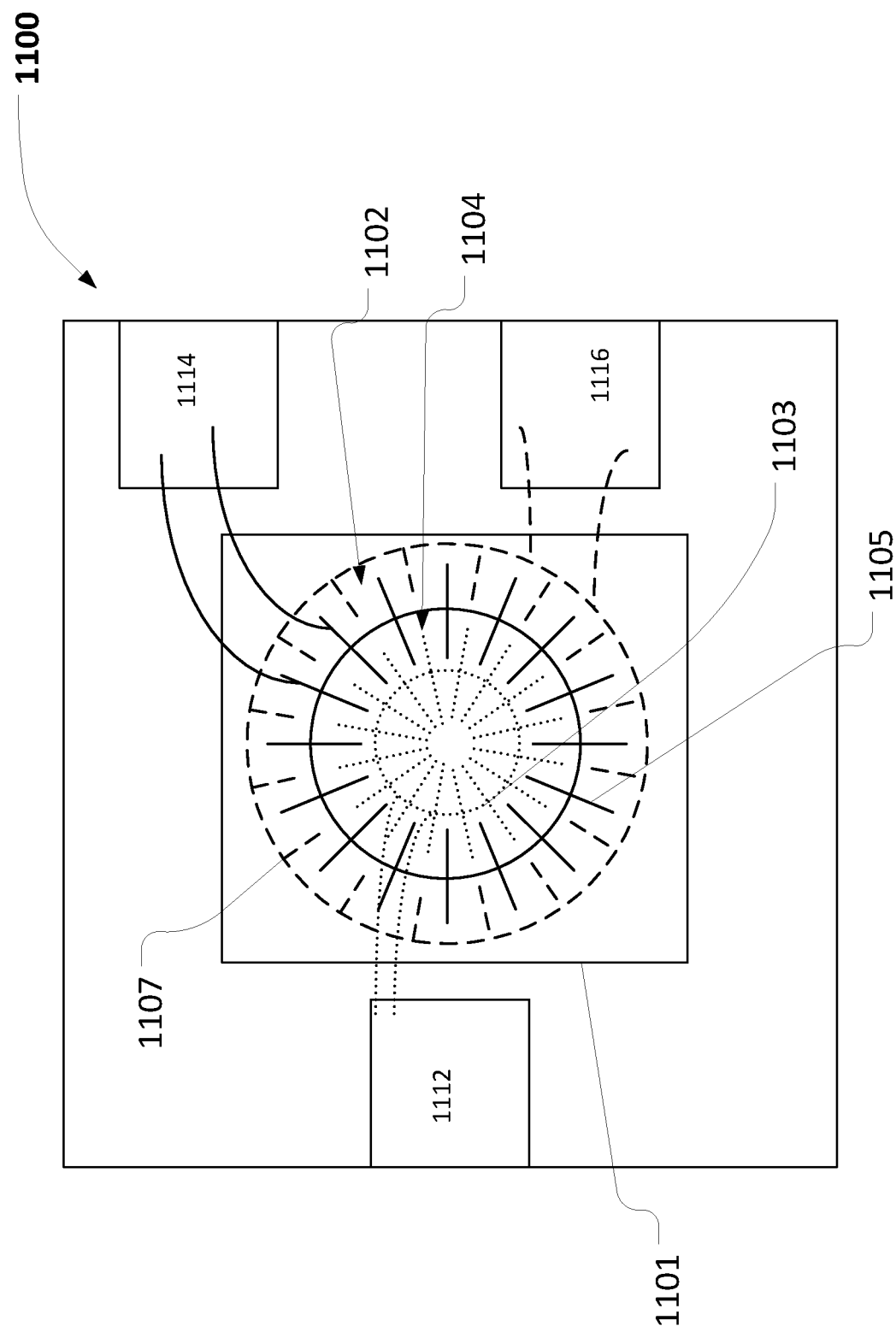
FIG. 11 illustrates a structure of another LED suitable for the illumination device according to the present invention.

FIG. 11 illustrates another embodiment of a LED having a number of emitting areas. In this embodiment the first side of the LED die 1101 is like in FIG. 3 covered by three circular current spreaders 1103, 1105, 1107. The current spreaders are connected to electrical conductors 1112, 1114, 1116, in the PCB whereon the LED die are mounted and each electrical conductor is connected to corresponding current controlling means. Further there are a number of regions where at least two the current spreaders overlaps. For instance:

current spreaders 1103 and 1105 overlap in region 1102;
current spreader 1105 and 1107 overlap in region 1102.

Figure 12:
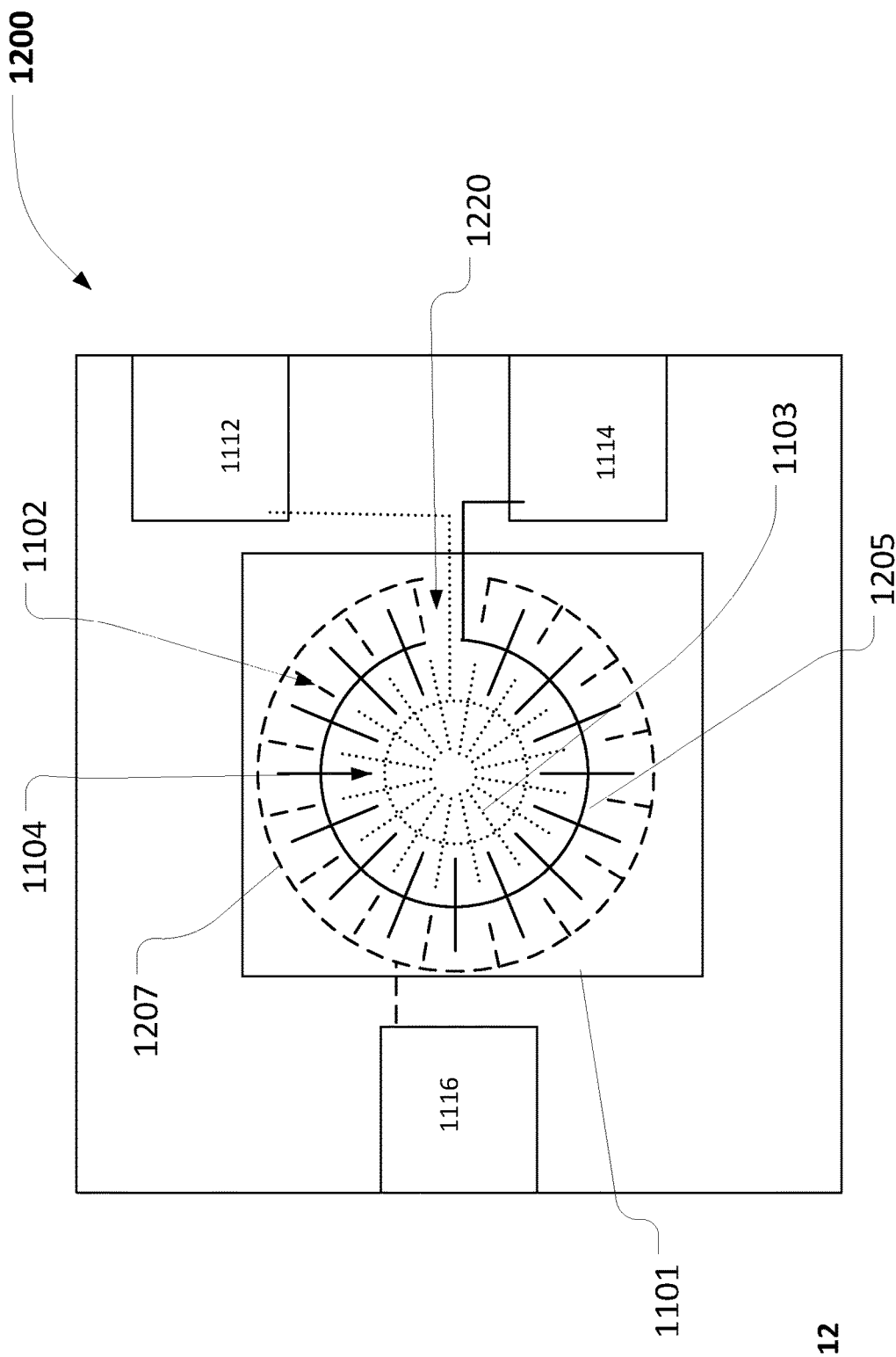
FIG. 12 illustrates a structure of another LED suitable for the illumination device according to the present invention.

FIG. 12 illustrates another embodiment of a LED having a number of emitting areas and illustrates a similar embodiment as in FIG. 11. In this embodiment the outer current spreaders 1205 and 1207 have been designed with a non-conducting region 1220 where through the inner current spreaders 1203 and 1205 can be feed.

Another aspect of the present invention is the fact LEDs according to prior art provided with a rectangular emitting area where the light is emitted equally from entire emitting area. These LED are thus difficult to use in projecting system having a circular gate as traditional used with in the entertainment industry, without experience loss of light. The present invention solve these problems by designing or controlling the current density through a LED die across the light emitting area to target a specific intensity distribution.

The idea's is to design or control the current density through a LED die across the light emitting area to target a specific intensity distribution.

This is done by applying a number of individually controllable current spreaders on the same die. The controllable regions could in principle be any shape. The regions can even reach into each other and be partially overlapping.

Static Design of One Connected Current Spreader

Figure 13:
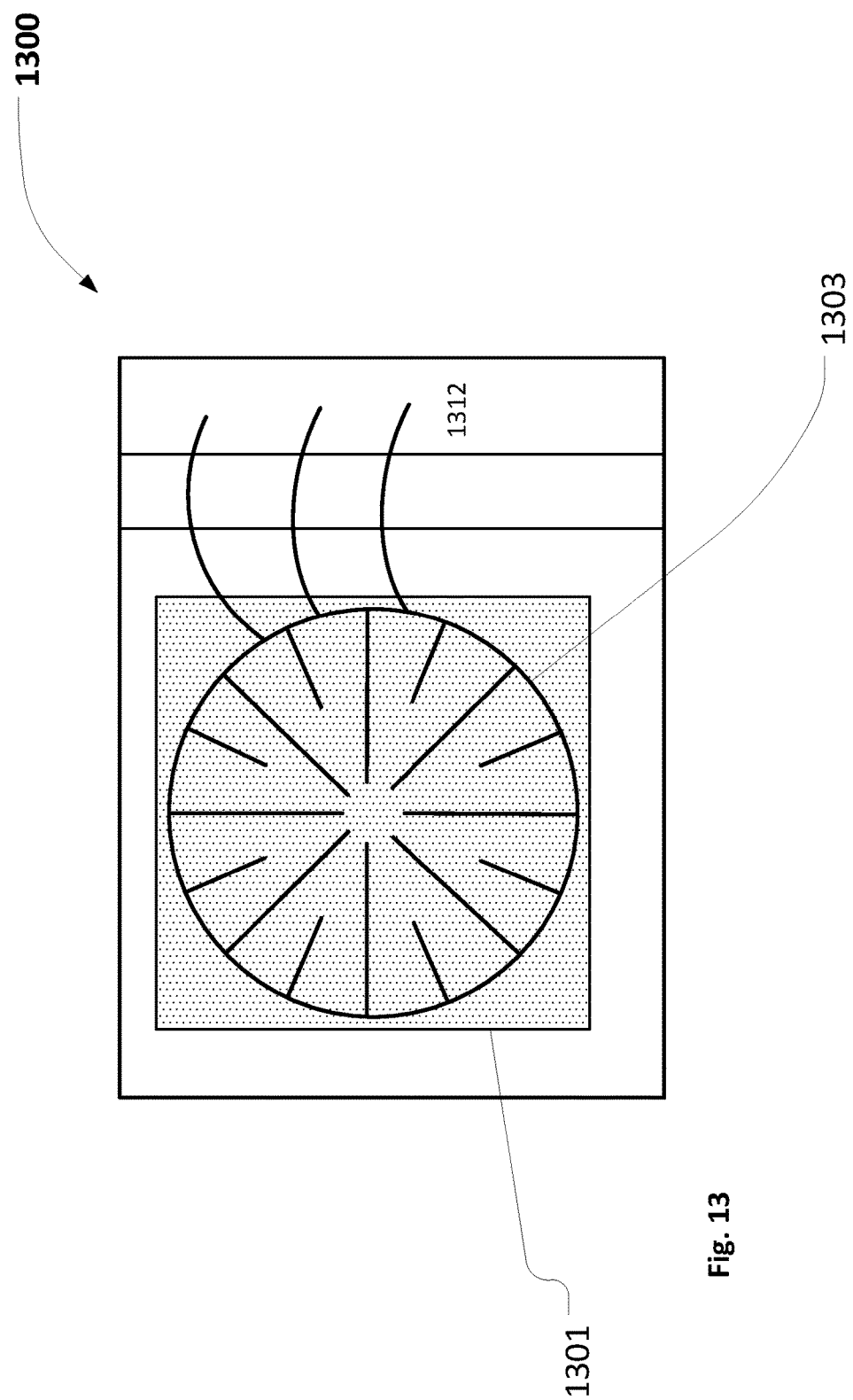
FIG. 13 illustrates a structure of another LED suitable for the illumination device according to the present invention.

FIG. 13 illustrates a light emitting diode 1300 according an aspect of the invention. The light emitting diode comprising:

a LED die 1301;
a first current spreader 1303 electronically connected to a first side of said LED die, said first current spreader covers a first area of said first side of said LED die;
a second wire (not shown) electronically connected to a second side of said LED die.

The first current spreader is adapted to distribute current in an irregularly pattern across said first area. The current spreader 1303 is, through a number of wires, connected to an electrical conductor 1312, in the PCB whereon the LED die 1301 is arranged.

It can be seen that the grid is irregularly distributed across the first side of the LED and the current will thus also be feed irregularly to the LED die.

The consequence is that the current spreader can be designed to provide different current density through the LED die, whereby the LED die will illuminate differently across its emitting surface. This is can for instance be achieved by providing the current spreader with areas having a more dense grid structure of electronic conductive threads whereby more current are fed to these areas; or by varying the thickness of the threads, as thicker threads can conduct more current; or by designing the current spreader of different material having different conducting properties.

The following are examples of further embodiments and way of usage.

A) To use a current spreader only covering an area of same shape as the gate in the optical system, so light is generated in the shape needed this will enhance optical efficiency. For instance a rectangular die=light emitting area is a bad match to a round gate causing reduced efficiency due to bad overlapping integral. Round to round is the perfect match.

B) The current spreader could be designed in any shape matching of fitted to the needs. For instance if static picture or logo is to be projected each color component in the picture could be matched with current spreader on die level and then combined by for instance a color cube. In this way waste of light and energy is saved.

C) The current spreader could be designed to have a little lower current density in the center, this will reduce/avoid temperature hotspot in the center and lead to a more even die temperature. This would lead to higher total current through same die area, and higher total lumen. Further this would also reduce intensity ration between center and edge= (hotspot) in a lighting luminaire where optical efficiency is typically higher in the center, causing hotspotted beam even with a uniform light source.

By using a round current spreader on a square die as illustrated in FIG. 2 only about 70% of the die area are used to create light. However in some embodiments it may be more cost effective to combine an illumination device with a current spreader adapted to distribute current in an irregularly pattern across said first area with a none symmetric light collector as described in the patent application titled "LIGHT COLLECTOR WITH COMPLEMENTING CENTRAL AND PERIPHERAL LENSES" and published under number WO 2011/076215 incorporated herein by reference. WO 2011/076215 describes a light collector for collecting light emitted by a light source and transforming the collected light into a light beam. The light collector comprises a central lens part aligned along an optical axis of the light source where the central lens comprises a central entrance surface and a central exit surface. The light collector also has a peripheral lens part surrounding at least of part of the central lens. The central lens and the peripheral lens is mutual adapted to convert the light emitted by the light source into a common light beam having a substantial circular and rotationally symmetric cross sectional light distribution. Such light collector can be combined with an illumination device according to the present invention where the light collector is partially adapted to transform a square/rectangular die into an almost round spot and were the current spreader is provided in an irregularly pattern across in order to provide a specific intensity distribution. In other words in such embodiment the central lens part, the peripheral lens part and the current spreader are mutually adapted to provide a predefined beam shape with a predefined intensity distribution. The light collector may be embodied as any optical means capable of collecting light and transforming the collected light into a light beam and may for instance be optical lenses, light rods, mirrors, reflectors etc. and where the optical properties of these optical elements are mutually adapted in relation to the current spreader of the LED.

FIG. 14a-14d illustrate a simplified cross-sectional view of an embodiment of an illumination deceive 1401 according to the present invention and illustrates how a multiple number of light sources and light collectors can be used. The light source are illustrated a light sources having only one emitting areas, however the skilled person relies that each light source can be embodied with a multiple number of light emitting areas and that the emitting areas wherefrom no light is being collected by the light collectors can be turned off as described above. FIG. 14a-14d illustrate the light collecting means and light sources in respectively a first position, a first mixing position, a second mixing position and in a second position. The illumination device 1401 comprises a number of light sources generating light, the light sources are arranged in a first group of light sources 1403 (illustrated as white quadrangles) and in a second group of light sources 1405 (illustrated as hatched quadrangles). In this embodiment the light sources are mounted close together for instance as LEDs on a PCB, surface mounted LEDs, chip on board LEDs, OLEDs or other illuminating surfaces. A number of light collecting means 1407 arrange in front of the light sources 1403 and 1405. In this embodiment each light collecting means are embodied as an optical light mixer, which is adapted to collect and mixed the collected light into a homogenized and uniform light beam.

Like in the embodiments described above the light collecting means 1407 and light sources 1403/1405 are movable in relation to each other between a first position (illustrated in FIG. 14a) and a second position (illustrated in FIG. 14d). Where, in the first position the light collecting means 1407 are adapted to collect light from the first group of light sources 1403 and to mix the collected light into a number of homogenized and uniform first light beams 1409. Similar in the second position the light collecting means 1407 are adapted to collect light from the second group of light sources 1405 and mix the collected light into a number of homogenized and uniform second light beams 1411.

In this embodiment the light sources and the light collecting means can be further positioned in a number of mixing positions (illustrated in FIGS. 14b and 14c) in relation to each other. Where, in the mixing positions, the light collecting means collect at least a part of the light from both the first group and the second group of light sources and mixed the collected light into a number of homogenized and uniform mixed light beams. As a consequence the mixed light beams comprise light from both the first group and second group of light sources.

FIG. 14b illustrates a first mixing position where each light collecting means 1407 are positioned above/in front of at least a part of a first group light source 1403 and at the same time also above/in front of at least a of a second group light source 1405. Each light collecting means collect thus light from both groups of light sources and mixes the collected light into a number of first mixed light beams 1451. In the first mixing position the light collecting means 1407 are positioned over/in front of a larger part of the first group of light sources than the part of the second group of light sources. As a consequence the light collecting means will collect more light form the first group of light sources than from the second group of light sources and the mixed light beams 1451 comprises thus a larger part of light form the first group of light sources than form the second group 1405 of light sources. This is illustrated by the fact that the light beams 1451 are illustrated as dashed lines with relatively long dashes.

In contrast hereto FIG. 14c illustrates a second mixing position where the light collecting means 1407 are positioned over a larger part of the second group of light sources than over the part of the first group of light sources. In the second mixing position the light form the first and second group of light sources is thus mixed into a number of second mixed light beams 1453 comprising a larger part of light form the second group of light sources than from the first group of light sources. This is illustrated by the fact that the light beams 1453 are illustrated as dashed lines with relatively short dashes.

This embodiment makes it possible to provide at number of homogenized and uniform mixed light beams where the homogenized and mixed light beams are constructed by combining light form two group of light sources. The mixing ratio defines how much light form the different groups of light sources that are uses in the homogenized and mixed light beams and can be varied by moving the light sources and the light collecting means in relation to each other. The light from the two groups of light sources can thus be mixed as known in the art of additive light mixing by moving the light collecting means and light sources in relation to each other. A uniform and homogenized light beam may be defined as a light beam where the cross sectional light distribution of different spectral components is substantially identical and where the beam diverges of different spectral components is substantially identical.

It is for instance possible to provide an additive color mixing illumination device by providing the first group and second group of light sources in with different spectral distribution for instance resulting in colors or color temperatures. In the first position (FIG. 14a) the illustrated illumination device 1401 will create a number of light beams having the color of the first group of light sources, as in this position the light collecting means 1407 will collect substantially light from the first group of light sources only. In the first mixing position (FIG. 14b) the illumination device 1401 will create a number of first mixed light beams 1451 having a first mixed color which is created by a combination of light from the first and second group of light sources. The first mixed color is more like the color of the first group of light sources, as the first mixed light beams comprises at larger part of light from the first group of light sources. Similar in the second mixing position (FIG. 14c) the illumination device will create a number of second mixed light beams 1453 having a second mixed color where the second mixed color is more like the color of the second group of light sources than like the color of first group of light sources, as the second mixed light beams comprises a larger part of light from the second group of light sources. In second position (FIG. 14d) the illustrated illumination device 1401 create a number of light beams having the color of the second light sources, as in this position the light collecting means 1407 will collect substantially light from the first group of light sources only.

The illustrated illumination device makes it possible to provide a color changing apparatus with very bright single colors like red, green and blue colors and also a very bright white light. This is archive as the Etendue limit can be optimized for the single colors as the light collecting means in these positions collects light form only one kind of light sources.

It is to be understood that more than two groups of light sources can be used and that the light collecting means in these embodiment are adapted to be positioned in different positions where the light collecting means collects different ratios of light form different groups of light sources. For instance illustrated in FIG. 7a-7k and described below.

FIG. 15a-15k illustrate and embodiment of an illumination device according to the present invention and illustrates how a multiple number of light sources and light collectors can be used. The light source are illustrated a light sources having only one emitting areas, however the skilled person relies that each light source can be embodied with a multiple number of light emitting areas and that the emitting areas wherefrom no light is being collected by the light collectors can be turned off as described above. Like the illumination devices described above this illumination device comprises a number of light sources generating light and number of light collecting means 1507a-g movable in relation to each other between a numbers of positions.

Figure 15A:
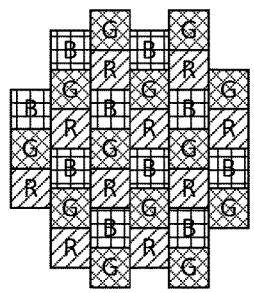
Figure 15B:
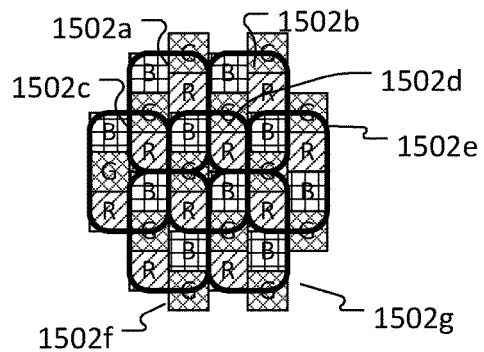

FIGS. 15a and 15b illustrate a top view of the light sources. The light sources are arrange in a first, a second and a third group of light sources where the first group comprises RED light sources R (illustrated as hatched quadrangles), the second group comprises GREEN light sources G (illustrated as cross hatched quadrangles) and the third group comprises BLUE light sources B (illustrated as square hatched quadrangles). The light sources are arranged in an array where each light source of each group is arranged adjacent to at least one light source of the two other groups. As a consequence:
each RED light source has at least one BLUE and one GREEN light source as neighbors;
each GREEN light source has at least one BLUE and one RED light source as neighbors;
each BLUE light source has at least one RED and one GREEN light source as neighbors.

Further the light sources are arranged in a number of clusters 1502a-1502g illustrated in FIG. 15b as transparent quadrangles with round corners in order to make it easier to identify each cluster. The clusters are arranged in a regular pattern; meaning that the center of the clusters are separated with substantial same mutual distance. Each cluster comprises a number of light sources from each group of light sources and the light sources are further arranged in identical patterns within each cluster. In this embodiment some of the clusters are overlapping each other and share some of the light sources for instance it can be seen the cluster 1502a share light sources with clusters 1502c and 1502d.

However this might not be the case in other embodiments and the clusters may also be separated by a distance.

FIGS. 15c, 15e, 15g and 15i illustrate top views of the light collectors 1507 and show the light collectors 1507a-g in different positions in relation to the light sources. The exit surface of the light collectors are illustrated as circles and it is possible to see through the light collectors 1507a-g and see the light sources R, G, B below the entrance surfaces (illustrated as squares) of the light collectors. FIGS. 15d, 15f and 15k illustrate a cross sectional views along line D-D of FIGS. 15c, 15e and 15g respectively; FIGS. 15j and 15k are a cross sectional views respectively along line E-E and F-F of FIG. 15i.

The light collectors 1507a-g are arranged in a regular pattern above/in front of the light sources (R, G and W) and the regular pattern regulate is substantially identical to the regular pattern of the clusters. Each light collector 1507a-1507-g is adapted to collect light from the light sources of a corresponding cluster and mix the converted light into a mixed light beam 1555a-1555e (the mixed light beams from light collector 1507f and 1507g are not shown). In this embodiment the light collectors 1507a-g will respectively collect light from cluster 1502a-g. The light collecting means 1507a-g and light sources (R, G and W) can be moved in relation to each other in a range allowing each light collector 1507a-g to collect light from all parts of the corresponding cluster 1502a-g. In other words the light collecting means and light sources are displaceable in relation to each other allowing the light collector 1507a-1507g to collect light from different parts of a corresponding cluster 1502a-1502g. Each light collector will collect substantially identical light because the light collecting means are arrange in the same pattern as the clusters and because the light sources are arrange in identical patterns within the clusters.

The light collectors 1507a-1507g are further embodied as optical light mixers carried by holder 1506. The holder 1506 is adapted to carried the light collectors and areas around the light collectors is embodied as a non transparent material and can thus block light from light sources emitting light outside the light collectors. The optical light mixers are adapted to mix the collected into a mixed light beams 1555a-1555e (the mixed light beams from light collector 1507f and 1507g are not shown) being homogenized and uniform and can for instance be embodied as described in the patent applicant filed in Denmark by the applicant on 23 Dec. 20110 under application number DK PA 2010 70580 and in cooperated herein by reference. In the illustrated embodiment the mixed light beams are further collimated and propagate substantially parallel with the optical axis 1513. As a consequence it is possible to concentrate the mixed light beam at an aperture 1519 along the optical axis 1513 independently of the positions of the light sources in relation to the light collectors. This is achieved by arranging optical convening means 1508 between the light collecting means 1507a-1507g and the aperture 1513. The optical convening means 1508 can be embodied as any optical component(s) capable of focusing the collimated mixed light beams 1555a-1555e at the aperture for instance by arranging the aperture 1519 are at the focal point of the optical components. In this embodiment the light sources are fixed in relation to the optical axis 1513, the optical convening means 1508 and the aperture 1519 whereas the light collectors are movable in relation to the light sources e.g. for instance by connecting the holder 1506 to an actuator (not shown). The light collectors can thus be moved and positioned in different positions in relation to the light sources; however it is to be understood it is also possible to move the light sources in relation to the light collecting means while fixing the light collectors or to moving both the light collectors and light sources at the same time.

Figure 15C:
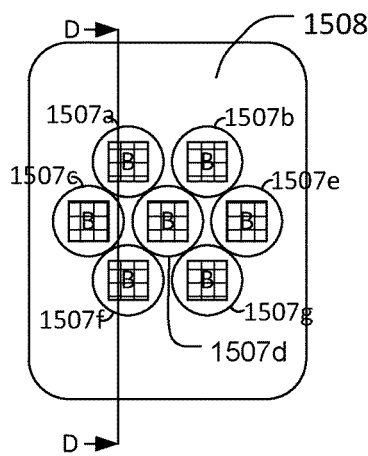
Figure 15D:
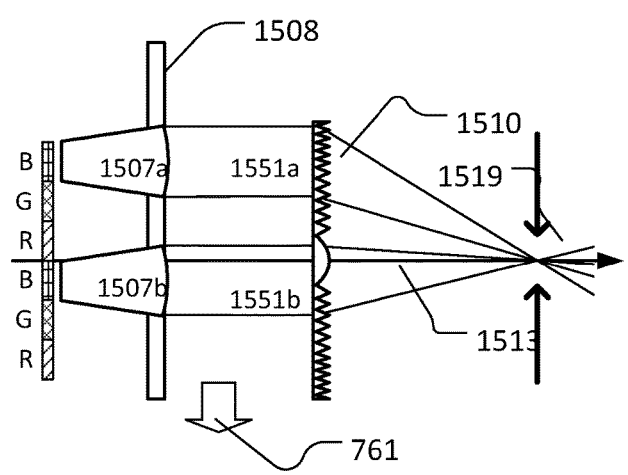

FIGS. 15c and 15d illustrate the light sources and the light collecting means in a position where the light collectors collect light form a BLUE light source B and the holder 1506 will block for light emitted by RED and GREEN light sources. The mixed light beams 1551a and 1551b will thus be blue whereby the aperture 1519 is illuminated by blue light. A gobo as known in the art entertainment lighting can thus be positioned at the aperture and be imaged at a target surface by a projecting system (not shown). The skilled person will understand that in this position the RED and GREEN light sources R and G may be turned off without effecting the outgoing light beam for instance in order to save energy.

Figure 15E:
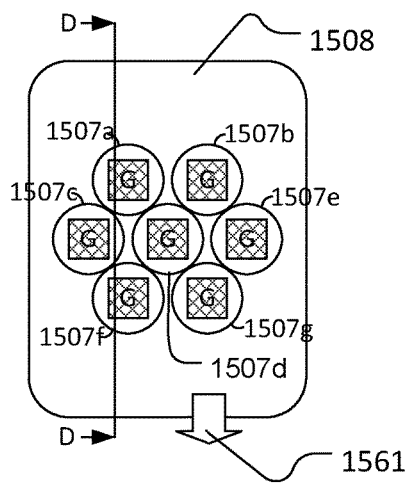
Figure 15F:
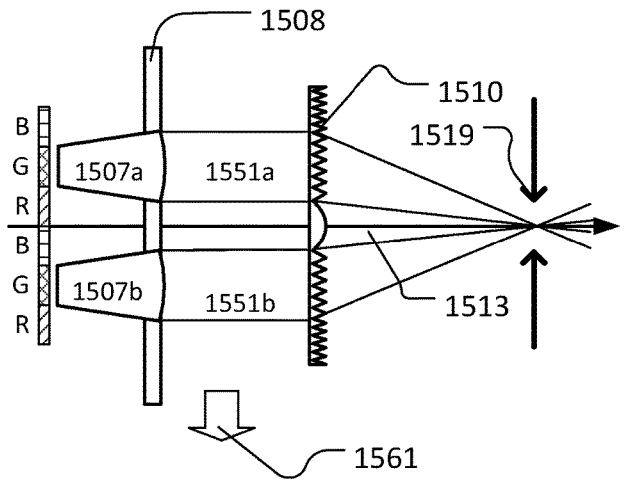

FIGS. 15e and 15f illustrate the light sources and the light collecting means in a position where the light collectors collect light form a GREEN light source and the holder 1506 will block for light emitted by RED and BLUE light sources. The mixed light beams 1551a and 1551b will thus be green. From the position shown in FIGS. 15c and 15d the light collecting means have been move a distance corresponding to the size of the BLUE and GREEN light sources and in a direction as indicated by arrow 1561.

FIGS. 15g and 15h illustrate the light sources and the light collecting means in a position where the light collectors collect half of the light form a GREEN light source and a half of the light from the RED light source, as the input surface is positioned approximately over half of the RED and GREEN light sources. The holder 1506 will block for light emitted by BLUE light sources and emitted by the other half of the RED and GREEN light sources. In this position the mixed light beams 1551a and 1551b will thus be a combination of red and green light which will be yellow. From the position shown in FIGS. 15e and 15f the light collecting means have been move a distance corresponding to the half size of the GREEN and RED light sources and in a direction as indicated by arrow 1563

FIGS. 15i, 15j, and 15k, illustrate light sources and the light collecting means in a position where the light collectors light form the GREEN, RED and BLUE light source. In this position the light collecting means will collect light from one half of the surface area of the BLUE light sources and quarter of surface area of the RED and GREEN light sources. In this position the mixed light beams 1551a and 1551b will thus be a combination of red, green and blue light with approximately twice as much blue light as red and green light and results in bright blue light. From the position shown in FIGS. 15g and 15h the light collecting means have been move a distance corresponding to the half size of the light sources and in a direction as indicated by arrow 1565.

The four positions illustrated in FIG. 15c-15k are just a few examples of a large number of positions in which the light sources and the light collecting means can be positioned in relation to each other. The skilled person realize that the light sources and light collectors can be positioned in many different positions where he light collectors collect different ratios of the light emitted by the different type of light sources whereby many different colors of the mixed light beams can be created. In the embodiment illustrated in FIG. 15a-15k the different types of light sources are illustrated as having same size and emitting the same amount of light pr. light pr. surface area. However it is to be understood that the different kind of light sources may have different size and emitted different amount of light and that the displacement of the light sources and the light collecting means in such situations can be adapted to create a predetermined color of the mixed light beams when the light collecting means and light sources are position in certain positions in relation to each other.

In the illustrated embodiments the optical light mixers are formed of a solid transparent material, where light enters said optical light mixer through an entrance surface and is reflected through said body to an exit surface where the light exit the optical light mixer. The light mixers can be formed as described in the patent application filed in Denmark by the applicant on 23 Dec. 20110 under application number DK PA 2010 70580 in cooperated herein by reference. It is to be understood that the light mixers can be formed as any known light mixer for instance as described in US2007/0024971, U.S. Pat. No. 6,200,002, U.S. Pat. No. 6,547,416 WO10113100A, WO10113101 also in-cooperated herein by reference.

It is further possible to combine the mechanical color mixing as described in FIG. 15a-15k with a traditional additive color mixing where the intensity of the different groups of light sources are varied relatively to each other electronically (such as AM, DC; PWM based systems system). In some situations it might be more energy efficient to provide color mixing using the mechanical color combining system while in other situations it may be more efficient to use the electronic color varying system.

It is also possible to provide the four groups of light sources where the first, second, third and fourth group of light sources respectively comprises red, green, blue and white LED. In this way a RGB-W illumination device can be created by adapting the light collecting means and light sources to be displaced in relation to each other in different positions where the light collecting means collects different ratios of light form the four groups of light sources. IT is to be understood that any number of different colored light sources can be combined.

A very interesting illumination device can be constructed by integrating the light emitting diodes into a illumination device according to the prior art and for instance adapting the illumination device to have means for controlling the current through the different current spreader individually whereby very interesting light effects can be achieved for instance an inverse iris, spotlights having variable and predetermined hotspots. It is for instance possible to integrate the light emitting diodes into projecting device where the light is concentrated at an aperture which is imaged at a target surface by a projecting system, for instance product MAC 350 Entrour™ provided by the applicant, Martin Professional a/s.

The invention claimed is:

1. An illumination device comprising:
   at least a first light source and at least a second light source, where said first light source and said second light source generate light having different spectral distribution;
   a number of light collecting means adapted to collect said generated light and to convert said collected light into a number of light beams, said light beams propagate along an optical axis;
   where said light sources and said light collecting means are displaceable in relation to each other and can be positioned and fixed in a number of mixing positions, where in said number of mixing positions said light collecting means are adapted to collect at least a part of said light emitted by said first light source and at least a part of said light emitted by said second light source, said light collecting means being further adapted to convert said collected light into number of mixed light beams characterized in that at least one of said light sources comprises at least a first emitting area and at least a second emitting area and in that said illumination device further comprises controlling means for controlling said first and said second emitting area independently of each other and in that in at least one first mixing position said light collecting means are adapted to collect at least a part of the light emitted from said first emitting area while substantially not collecting light emitted from said second emitting area of said first light source.

2. An illumination device according to claim 1 characterized in said controlling means are adapted to turn off said second emitting area when said light sources and said light collecting means are positioned in said first mixing position.

3. An illumination device according to claim 1 characterized in that said first light source is a LED comprising:
   a LED die;
   a first current spreader electronically connected to a first side of said LED die, said first current spreader covers said first emitting area of said first side of said LED die;
   a second wire electronically connected to a second side of said LED die;
   a second current spreader electronically connected to said first side of said LED die, said second current spreader covers said second emitting area of said first side of said LED die;
   and in that said controlling means for controlling said first emitting area and said second emitting area comprises:
   first current controlling means controlling current flowing through said first current spreader; and
   second current controlling means controlling current flowing through said second current spreader.

4. An illumination device according to claim 3 characterized in that said second current controlling means is adapted to turn off said current flowing through said second current spreader when said light collecting means are positioned in said at least one first mixing position.

5. An illumination device according to claim 3 characterized in that said at least said first area of said first side of said LED die or said second area of said first side of said LED die is covered by a converting material adapted to convert pumping light having at least a first wavelength into converted light having a second wavelength, where said second wavelength is different from said first wavelength.

6. An illumination device according to claim 1 characterized in that an aperture is positioned along said optical axis and in that said light collecting means is adapted to concentrate said light beams at said aperture.

7. An illumination device according to claim 1 characterized in that said illumination device further comprises a projection system arranged along said optical axis, said projecting system is adapted to change the divergence of said generated light.

8. An illumination device according to claim 6 characterized in that said projecting system is adapted to image said aperture at a distance along said optical axis.

* * * * *